US012625200B2

(12) United States Patent
Chernyy et al.

(10) Patent No.: US 12,625,200 B2
(45) Date of Patent: May 12, 2026

(54) NAVIGATION VIA MAGNETIC FIELD LOCALIZATION WITH PSEUDO-RANDOM DATA SEQUENCES

(71) Applicant: SB Technology, Inc., Wilmington, DE (US)

(72) Inventors: Nikolai Chernyy, Palo Alto, CA (US); Kimberly Moore, Redwood City, CA (US); Luca Ferrara, Redwood City, CA (US); Andrew Ayomide Awoyemi Sosanya, New York, NY (US)

(73) Assignee: SB Technology, Inc., Wilmington, DE (US)

( * ) Notice: Subject to any disclaimer, the term of this patent is extended or adjusted under 35 U.S.C. 154(b) by 704 days.

(21) Appl. No.: 17/964,841

(22) Filed: Oct. 12, 2022

(65) Prior Publication Data

US 2024/0125871 A1 Apr. 18, 2024

(51) Int. Cl.
*G01R 33/02* (2006.01)
*G01R 33/38* (2006.01)

(52) U.S. Cl.
CPC ......... *G01R 33/02* (2013.01); *G01R 33/3806* (2013.01)

(58) Field of Classification Search
CPC ... G01R 33/02; G01R 33/3806; G01S 5/0205; G01S 5/16; G01S 5/00
See application file for complete search history.

(56) References Cited

U.S. PATENT DOCUMENTS

| | | | |
|---|---|---|---|
| 6,549,004 B1 | 4/2003 | Prigge | |
| 2014/0266160 A1 | 9/2014 | Coza | |

FOREIGN PATENT DOCUMENTS

WO WO2016209503 A1 12/2016

OTHER PUBLICATIONS

Prigge et al, "An indoor absolute positioning system with No. line of sight restrictions and building-wide coverage," Proceedings 2000 ICRA. Millennium Conference. IEEE International Conference on Robotics and Automation. Symposia Proceedings, San Francisco, CA, USA, 2000, pp. 1015-1022 vol. 2 (Year: 2000).*

(Continued)

*Primary Examiner* — Daniel R Miller
(74) *Attorney, Agent, or Firm* — Morgan, Lewis & Bockius LLP

(57) ABSTRACT

This application is directed to a local positioning system having a plurality of wire coils. Each wire coil includes one or more respective turns of wire that have a respective shape and a respective size and are arranged substantially in parallel with a respective wire plane. Each wire coil is configured to be electrically driven by a respective synchronous electric current carrying a respective train of pseudo-random waveforms according to a predefined bandwidth. For each wire coil, the respective train of pseudo-random waveforms includes a first number of waveform periods and is orthogonal to each other train of pseudo-random waveforms of the wire coils. In some embodiments, a receiver system is coupled to, and measures, the magnetic field created by the wire coils during each waveform period. The location of the receiver system is determined based on measured magnetic data vectors of the magnetic field.

20 Claims, 12 Drawing Sheets

(56) References Cited

OTHER PUBLICATIONS

E. A. Prigge and J. P. How, "Signal architecture for a distributed magnetic local positioning system," in IEEE Sensors Journal, vol. 4, No. 6, pp. 864-873, Dec. 2004 (Year: 2004).*

F. Wu, Y. Liang, Y. Fu and X. Ji, "A robust indoor positioning system based on encoded magnetic field and low-cost IMU," 2016 IEEE/ION Position, Location and Navigation Symposium (PLANS), Savannah, GA, USA, 2016, pp. 204-212 (Year: 2016).*

G. De Angelis, A. De Angelis, A. Comuniello, A. Moschitta and P. Carbone, "Simultaneous RSS Measurements Using Multiple Inductively Coupled Coils," 2019 IEEE International Symposium on Measurements & Networking (M&N), Catania, Italy, 2019, pp. 1-6 (Year: 2019).*

SB Technology, Inc., PCT/US2023/035053, International Search Report and Written Opinion, Mar. 4, 2024 20 pgs.

* cited by examiner

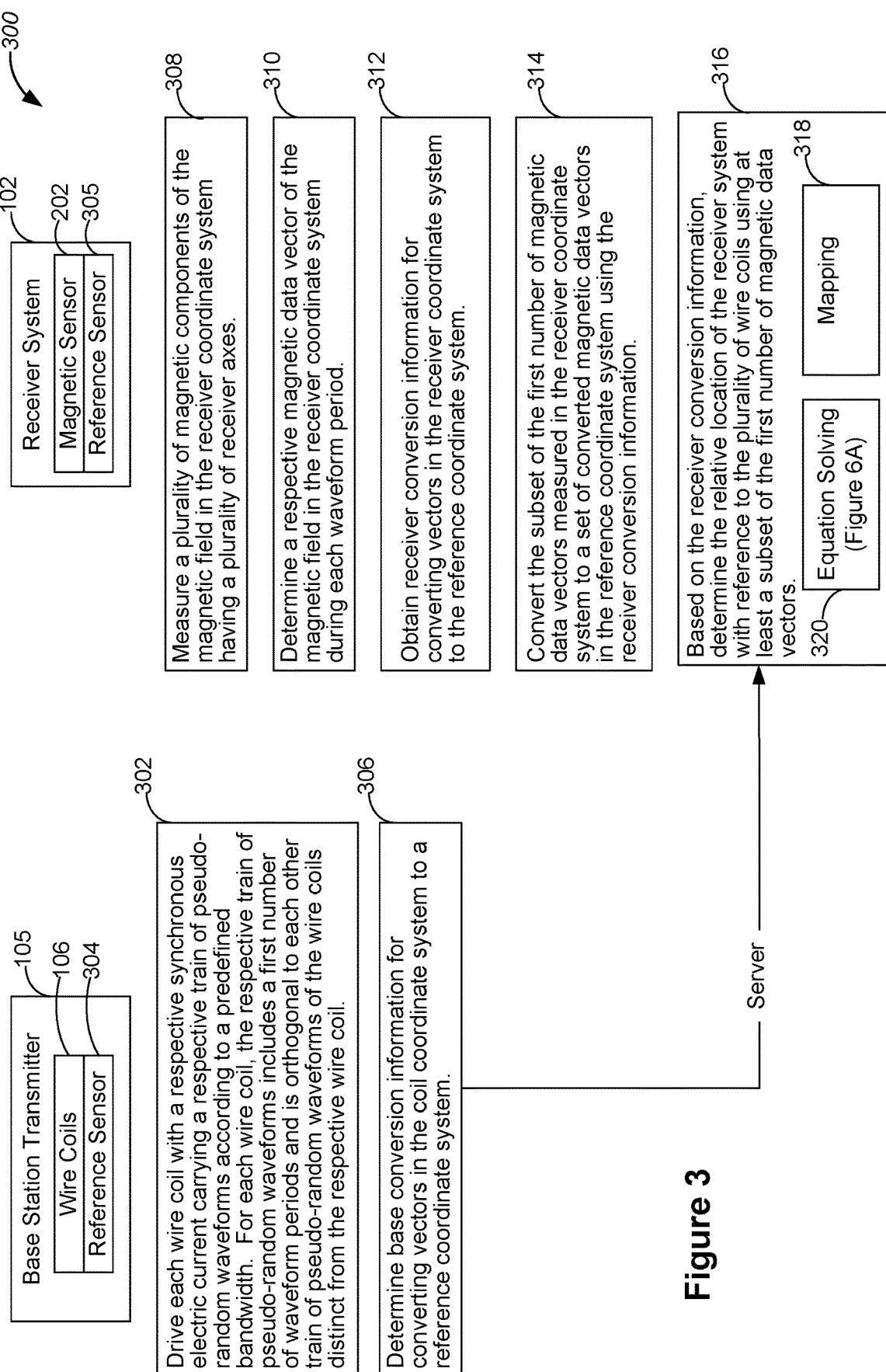

300

Receiver System ⁓102
  Magnetic Sensor ⁓202
  Reference Sensor ⁓305

308 Measure a plurality of magnetic components of the magnetic field in the receiver coordinate system having a plurality of receiver axes.

310 Determine a respective magnetic data vector of the magnetic field in the receiver coordinate system during each waveform period.

312 Obtain receiver conversion information for converting vectors in the receiver coordinate system to the reference coordinate system.

314 Convert the subset of the first number of magnetic data vectors measured in the receiver coordinate system to a set of converted magnetic data vectors in the reference coordinate system using the receiver conversion information.

316 Based on the receiver conversion information, determine the relative location of the receiver system with reference to the plurality of wire coils using at least a subset of the first number of magnetic data vectors.

320 Equation Solving (Figure 6A)   Mapping ⁓318

Base Station Transmitter ⁓105
  Wire Coils ⁓106
  Reference Sensor ⁓304

302 Drive each wire coil with a respective synchronous electric current carrying a respective train of pseudo-random waveforms according to a predefined bandwidth. For each wire coil, the respective train of pseudo-random waveforms includes a first number of waveform periods and is orthogonal to each other train of pseudo-random waveforms of the wire coils distinct from the respective wire coil.

306 Determine base conversion information for converting vectors in the coil coordinate system to a reference coordinate system.

Server

Figure 3

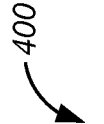
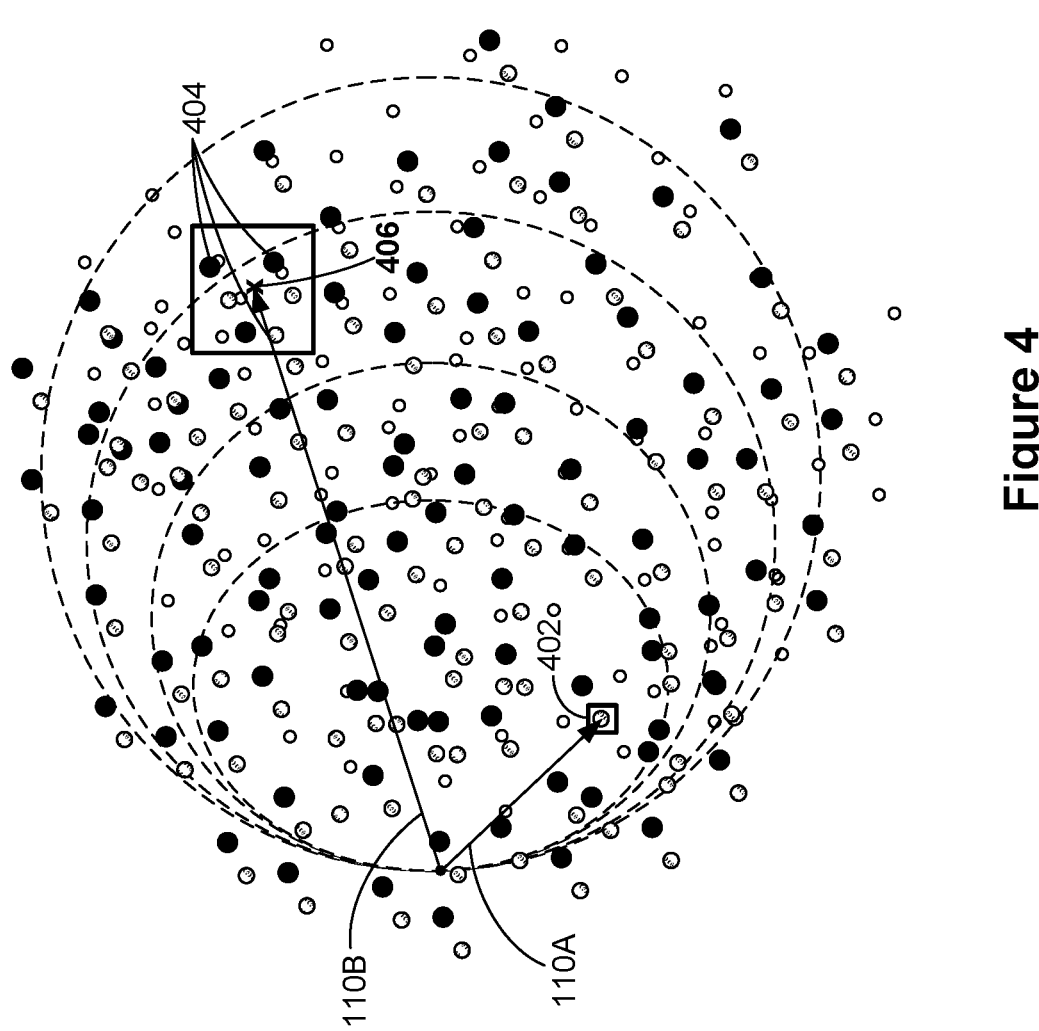
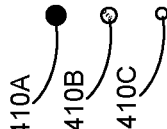
Figure 4

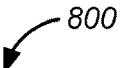

*800*

Provide a plurality of wire coils, each wire coil including one or more respective turns of wire that have a respective shape and a respective size and are arranged substantially in parallel with a respective wire plane. ⟋802

Each wire coil is configured to be electrically driven by a respective synchronous electric current carrying a respective train of pseudo-random waveforms according to a predefined bandwidth. ⟋804

For each wire coil, the respective train of pseudo-random waveforms includes a first number of waveform periods and is orthogonal to each other train of pseudo-random waveforms of the wire coils distinct from the respective wire coil. ⟋806

The plurality of wire coils includes three identical wire coils having the same shape and the same size. Respective wire planes of the plurality of wire coils are perpendicular to each other and intersect at a common origin node. Respective dipole axes of the plurality of wire coils are perpendicular to each other and intersect at the common origin node. ⟋808

At least one of the plurality of wire coils is configured to transmit a supplemental communication message, and the supplemental communication message is inserted between two repeated trains of pseudo-random waveforms. ⟋810

Each wire coil is configured to transmit (814) integrity data with the respective train of pseudo-random waveforms according to the predefined bandwidth. ⟋812

Provide a controller to determine the accuracy level of a global positioning system (GPS) in a location where the plurality of wire coils are. When the accuracy level is lower than an accuracy requirement, enable driving each of the plurality of wire coils with the respective synchronous electric current. ⟋814

Provide a receiver system communicatively coupled to the plurality of wire coils via the magnetic field of the plurality of wire coils. ⟋816

The receiver system is configured to measure the magnetic field during each waveform period. ⟋818

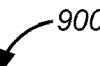

At a receiver system coupled in a magnetic field of a plurality of wire coils: — 902

> The magnetic field is generated by the plurality of wire coils, each of which is driven by a respective synchronous electric current carrying a respective train of pseudo-random waveforms according to a predefined bandwidth. — 904

> For each wire coil, the respective train of pseudo-random waveforms includes the first number of waveform periods and is orthogonal to each other train of pseudo-random waveforms of the wire coils distinct from the respective wire coil. — 906

> Measure the magnetic field during each waveform period of a first number of successive waveform periods. — 908
>
> > The receiver system includes a plurality of receiver sensors configured to measure a plurality of magnetic components of the magnetic field in a receiver coordinate system having a plurality of receiver axes. — 920

> Determine a respective magnetic data vector of the magnetic field during each waveform period. — 910
>
> > The first number of successive waveform periods corresponds to the first number of magnetic data vectors. — 912

> Determine the relative location of the receiver system with reference to the plurality of wire coils using at least a subset of the first number of magnetic data vectors. — 914
>
> > Obtain the base geographical location of the plurality of wire coils. — 916
> >
> > Determine the object geographical location of the receiver system based on the relative location of the receiver system and the base geographical location of the plurality of wire coils. — 918
> >
> > The receiver system further includes a reference sensor configured to identify the reference coordinate system. — 922
> >
> > The receiver system converts the subset of the first number of magnetic data vectors measured in the receiver coordinate system into a set of converted magnetic data vectors in the reference coordinate system using the receiver conversion information. — 924

NAVIGATION VIA MAGNETIC FIELD LOCALIZATION WITH PSEUDO-RANDOM DATA SEQUENCES

TECHNICAL FIELD

The disclosed embodiments relate generally to navigation technology, including methods and systems for navigating in a region using a local positioning system (LPS).

BACKGROUND

The Global Navigation Satellite System (GNSS) uses constellations of satellites to determine a receiver's location with respect to the satellites based on trilateration. Global Positioning System (GPS) is one type of GNSS that has been widely applied to provide geolocation and time information to military, civil, and commercial users around the world. Each GPS satellite continuously broadcasts a low-rate navigation message on two frequencies (i.e., 1.57542 GHz and 1.2276 GHz) at a rate of 50 bits per second. The satellite network applies a code-division multiple access (CDMA) spread-spectrum technique to encode the low-rate navigation message with a high-rate pseudo-random (PRN) sequence (i.e., Gold codes) that is different for each satellite. Satellite signals are associated with corresponding satellites based on the Gold codes, and decoded at the receiver. Despite its wide application, the GPS has a limited accuracy level in areas with poor satellite signals, and is susceptible to adversarial jamming or spoofing. As such, there is a critical need to develop positioning methods or systems that complement GPS and operate independently of GPS.

SUMMARY

Various embodiments of systems, methods and devices within the scope of the appended claims each have several aspects, no single one of which is solely responsible for the attributes described herein. After considering this disclosure, one will understand how the aspects of various embodiments are used for position localization in navigation operations. A base station transmitter is located at a known location and transmits to one or more distant receivers distinct actively-generated magnetic waveforms along a plurality of spatial axes (e.g., along three normal spatial axes). Properties of the corresponding magnetic field are measured and used to determine each receiver's location with respect to the base station transmitter. The magnetic waveforms are encoded using orthogonal pseudo-random sequences, and optionally transmitted with supplemental communication messages. The base station transmitter and one or more receivers form a local positioning system (LPS), which offers a desirable positioning range, signal-to-noise ratio, and synchronization performance. Such an LPS can be applied to localize a receiver system in areas having limited GPS signals to complement or replace GPS.

Some embodiments of this application leverage orthogonal waveforms to drive a base station transmitter located at a known location and rely on solving for magnetic data vectors from a receiver to the base station transmitter to update the location of the receiver. In accordance with one aspect of the application, an LPS includes a plurality of wire coils. Each wire coil includes one or more respective turns of wire that have a respective shape and a respective size, and are arranged substantially in parallel with a respective wire plane. Each wire coil is configured to be electrically driven by a respective synchronous electric current carrying a respective train of pseudo-random waveforms according to a predefined bandwidth. In some embodiments, the respective synchronous electric current carries the respective train of pseudo-random waveforms according to a predefined phase. For each wire coil, the respective train of pseudo-random waveforms includes a first number of waveform periods and is orthogonal to each other train of pseudo-random waveforms of the wire coils distinct from the respective wire coil.

In another aspect, a method is implemented for providing an LPS. The method includes providing a plurality of wire coils. Each wire coil includes one or more respective turns of wire that have a respective shape and a respective size and are arranged substantially in parallel with a respective wire plane. Each wire coil is configured to be electrically driven by a respective synchronous electric current carrying a respective train of pseudo-random waveforms according to a predefined bandwidth. For each wire coil, the respective train of pseudo-random waveforms includes a first number of waveform periods and is orthogonal to each other train of pseudo-random waveforms of the wire coils distinct from the respective wire coil.

In yet another aspect of the application, an LPS includes a receiver system located within the magnetic field of a plurality of wire coils. The receiver system is configured to measure the magnetic field during each waveform period of a first number of waveform periods and determine a respective magnetic data vector of the magnetic field during each waveform period. The first number of waveform periods corresponds to the first number of magnetic data vectors. The receiver system is configured to determine the relative location of the receiver system with reference to the plurality of wire coils using at least a subset of the first number of magnetic data vectors. The magnetic field is generated by the plurality of wire coils, each of which is configured to be driven by a respective synchronous electric current carrying a respective train of pseudo-random waveforms according to a predefined bandwidth. For each wire coil, the respective train of pseudo-random waveforms includes the first number of waveform periods and is orthogonal to each other train of pseudo-random waveforms of the wire coils distinct from the respective wire coil.

In another aspect, a method is implemented at a receiver system located within the magnetic field of a plurality of wire coils for local positioning. The method includes measuring the magnetic field during each waveform period of a first number of waveform periods and determining a respective magnetic data vector of the magnetic field during each waveform period. The first number of waveform periods corresponds to the first number of magnetic data vectors. The method further includes determining the relative location of the receiver system with reference to the plurality of wire coils using at least a subset of the first number of magnetic data vectors. The magnetic field is generated by the plurality of wire coils, each of which is configured to be driven by a respective synchronous electric current carrying a respective train of pseudo-random waveforms according to a predefined bandwidth. For each wire coil, the respective train of pseudo-random waveforms includes the first number of waveform periods and is orthogonal to each other train of pseudo-random waveforms of the wire coils distinct from the respective wire coil.

These illustrative embodiments and implementations are mentioned not to limit or define the disclosure, but to provide examples to aid understanding thereof. Additional embodiments are discussed in the Detailed Description, and further description is provided there.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

FIG. 3 is a flow diagram of an example method for localizing a receiver system 102 in a magnetic field 104 created by a base station transmitter, in accordance with some embodiments.

FIG. 4 is a local field map indicating a magnetic field vector projected onto a reference coordinate system, in accordance with some embodiments.

FIG. 8 is a flow diagram of an example method for providing an LPS, in accordance with some embodiments.

FIG. 9 is a flow diagram of another example method for determining the position of a receiver system in an LPS, in accordance with some embodiments.

Like reference numerals refer to corresponding parts throughout the several views of the drawings.

DESCRIPTION OF EMBODIMENTS

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, mechanical structures, circuits, and networks have not been described in detail so as not to unnecessarily obscure aspects of the embodiments.

Various embodiments of this application are directed to position localization using navigation operations. A base station transmitter (e.g., a wire coil) is located at a known location and creates a magnetic field where one or more distant receiver sensors measure magnetic data vectors and determine each receiver's location with respect to the base station transmitter. The magnetic field is created by magnetic waveforms that are encoded with orthogonal pseudo-random sequences. The base station transmitter and one or more receivers form an LPS that offers a desirable positioning range, signal-to-noise ratio, and synchronization performance. Additionally, strong code autocorrection is applied to localize the receiver in time with respect to the base station transmitter and determine positions based on both time of flight and power, which complements varying attenuation through materials that interact with the magnetic field. Such an LPS can be applied in areas having no or limited GPS signals.

Figure 1:
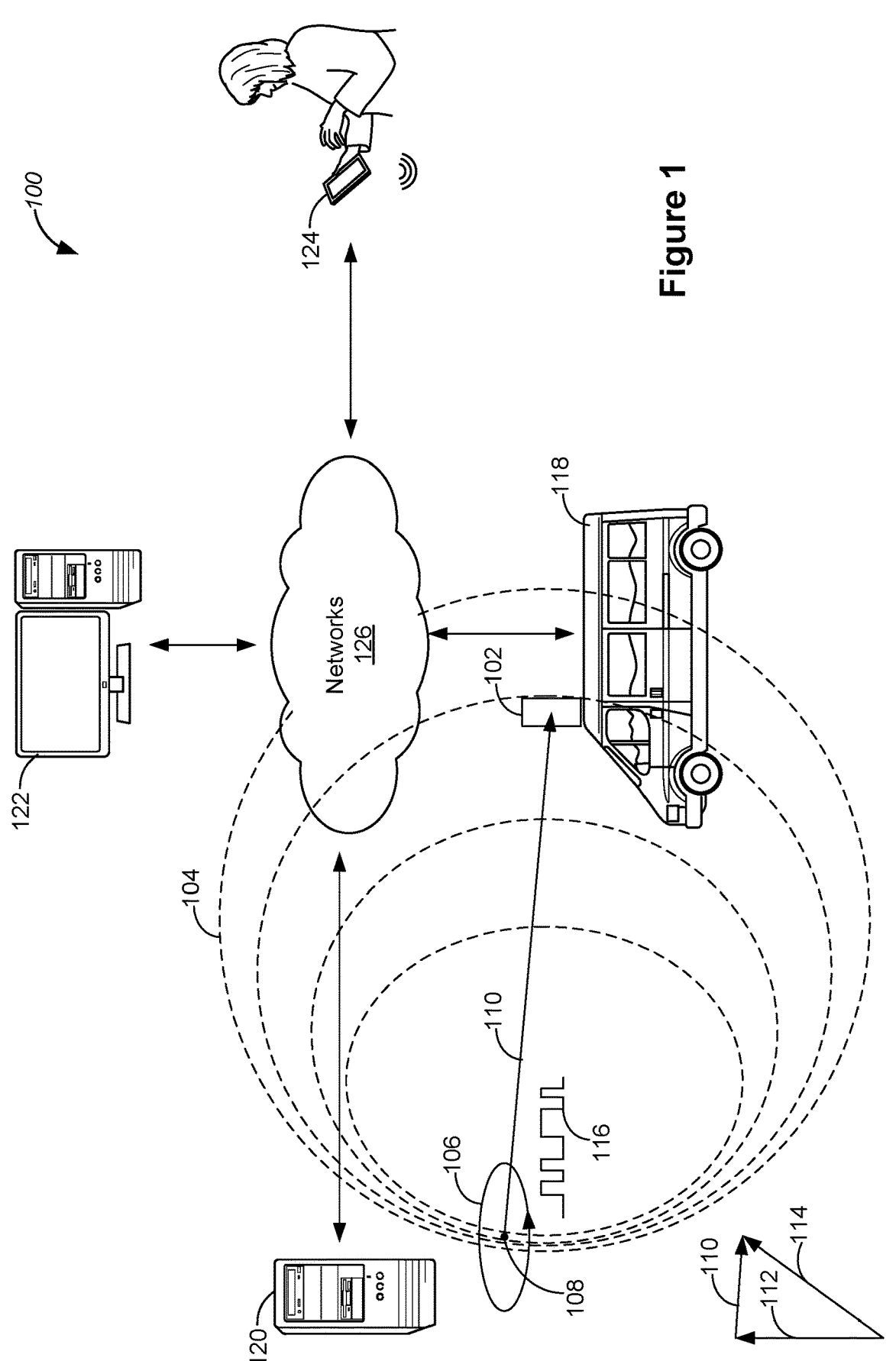
FIG. 1 is an example local positioning environment where a receiver system is localized based on a magnetic field, in accordance with some embodiments.

FIG. 1 is an example local positioning environment 100 where a receiver system 102 is localized based on a magnetic field 104, in accordance with some embodiments. The magnetic field 104 is created in the local positioning environment 100 by a base station transmitter 105 including a plurality of wire coils 106. The plurality of wire coils 106 are located at a first known location 108 (e.g., location 108A in FIG. 2A) or distributed among a plurality of second known locations (e.g., the locations 108 in FIGS. 2B and 2C). The receiver system 102 includes one or more receiver sensors (e.g., 202A-202C in FIGS. 2A-2C) configured to measure one or more magnetic components of the magnetic field 104. When the receiver system 102 is located in the magnetic field 104, the receiver system 102 determines respective magnetic data vectors (e.g., the data vector 220 in FIGS. 2A-2C) of the magnetic field 104 according to a sampling rate. Based on the respective magnetic data vectors of the magnetic field 104, the receiver system 102 determines the relative location 110 with reference to the first or second known locations 108 of the plurality of wire coils 106. In some embodiments, the first and second known locations 108 correspond to a base geographical location 112 in a geographic coordinate system (GCS), which defines locations on a model of the surface of the earth. The receiver system 102 is configured to determine an object geographical location 114 of the receiver system 102 in the GCS based on the relative location 110 of the receiver system 102 and the base geographical location 112 of the plurality of wire coils 106.

In the base station transmitter 105, each wire coil 106 includes one or more respective turns of wire, and is configured to be electrically driven by a respective synchronous electric current carrying a respective train of pseudo-random waveforms 116 according to a predefined bandwidth and predefined phase. For each wire coil 106, the respective train of pseudo-random waveforms 116 includes a first number ($N_1$) of waveform periods and is orthogonal to each other train of pseudo-random waveforms of the wire coils distinct from the respective wire coil. In some embodiments, the first number ($N_1$) of waveform periods is repeated every first number of waveforms. The receiver system 102 collects one or more magnetic signals associated with the magnetic field 104 during each waveform period to determine a magnetic data vector of the magnetic field 104. The magnetic data vector of the magnetic field 104 has a varying magnitude and a varying direction based on the location of the receiver system 102 in the magnetic field 104.

The base station transmitter 105 and receiver system 102 are coupled to each other via the magnetic field 104. In some embodiments, the receiver system 102 is mounted on a transportation vehicle 118 (e.g., a bicycle or a motor vehicle). Alternatively, in some embodiments, the receiver system 102 is carried by a person. When the transportation vehicle 118 or the person enters or roams in the magnetic field 104, the receiver system 102 is configured to measure the magnetic field 104 and determine the relative location 110 or object geographical location 114 of the transportation vehicle 118 or person. In some embodiments, the base station transmitter 105 includes a controller 120 configured to determine the accuracy level of a global positioning system (GPS) in the region surrounding the plurality of wire coils 106. In accordance with a determination that the accuracy level is lower than an accuracy requirement, the controller enables driving each of the plurality of wire coils with the respective synchronous electric current. The receiver system 102 is configured to determine the accuracy level of the GPS in the region surrounding the plurality of wire coils 106. When the accuracy level is lower than an accuracy requirement, the receiver system 102 switches to searching for the magnetic field 104 and identifying its relative location 110 with reference to the base station transmitter 105 or the object geographic location 114 in the GCS. Further, in some situations, when the base station transmitter 105 provides the magnetic field 104, the receiver system 102 independently determines whether to use the GPS or an LPS provided by the base station transmitter 105.

In some embodiments, the base station transmitter 105 further includes one or more processors (e.g., including the controller 120) and memory storing one or more programs. The base station transmitter 105 is configured to execute the one or more programs to drive the plurality of wire coils 106. In some embodiments, the base station transmitter 105 is communicatively coupled to another base station transmitter 105, a server 122, a client device 124, or the receiver system 102 in the local positioning environment 100. The base station transmitter 105 is configured to receive context information or specific instructions for generating the magnetic field 104 and provide information of the magnetic field 104 to other devices in the environment 100.

In some embodiments, the receiver system 102 is coupled to, or further includes, one or more processors and memory storing one or more programs. The receiver system 102 is configured to measure the magnetic components of the magnetic field 104, determine respective magnetic data vectors of the magnetic field 104, and determine its relative location 110 or geographical location 114. In some embodiments, the receiver system 102 is communicatively coupled to a base station transmitter 105, a server 122, a client device 124, or another receiver system 102 in the local positioning environment 100. The receiver system 102 is configured to receive context information (e.g., the base geographical location 112 of the base station transmitter 105) or specific instructions for measuring the magnetic field 104 and localizing the receiver system 102, and provide magnetic data, location information, or supplemental information to other devices in the environment 100.

In some embodiments, the server 122 provides a central local positioning platform for collecting data from the base station transmitter 105 or receiver system 102, monitoring device operation, detecting faults, providing operation solutions, and updating additional device information to the base station transmitter 105 or receiver system 102. In some embodiments, the server 122 manages data of each base station transmitter 105 or receiver system 102 separately. In some embodiments, the server 122 consolidates data from multiple base station transmitters 105 and/or receiver systems 102 and manages the consolidated data jointly (e.g., the server 122 statistically aggregates the data).

In some embodiments, the local positioning environment 100 further includes one or more client devices 124, and each client device 124 is configured to execute a client user application associated with the central local positioning platform provided by the server 122. Examples of the client device 124 include desktop computers, laptop computers, tablet computers, and mobile phones. The client device 124 is logged into a user account on the client user application, and the user account is associated with the base station transmitter 105 or receiver system 102. The server 122 provides the collected data and additional information (e.g., device operation information, fault information, or operation solution information) for the base station transmitter 105 or receiver system 102 to the client device 124 using the user account of the client user application. In some embodiments, the client device 124 is located in the transportation vehicle 118 coupled to the receiver system 102, while in other embodiments, the client device 124 is at a location distinct from the base station transmitter 105 and distinct from the receiver system 102.

In some embodiments, the base station transmitter 105, receiver system 102, server 122, and one or more client devices 124 are communicatively coupled to each other via one or more communication networks 126, which provide communication links between these devices and other computing machines connected together within the local positioning environment 100. The one or more communication networks 126 may include the magnetic field 104, and may include connections, such as a wired network, wireless communication links, or fiber optic cables. Examples of the one or more communication networks 126 are local area networks (LAN), wide area networks (WAN), such as the Internet, or a combination thereof. The one or more communication networks 126 are, in some embodiments, implemented using any known network protocol, including various wired or wireless protocols, such as Ethernet, Universal Serial Bus (USB), FIREWIRE, Long Term Evolution (LTE), Global System for Mobile Communications (GSM), Enhanced Data GSM Environment (EDGE), code division multiple access (CDMA), time division multiple access (TDMA), Bluetooth, Wi-Fi, voice over Internet Protocol (VoIP), Wi-MAX, or any other suitable communication protocol. A connection to the one or more communication networks 126 may be established either directly (e.g., using 3G/4G connectivity to a wireless carrier), or through a network interface (e.g., a router, a switch, a gateway, a hub, or an intelligent, dedicated whole-home control node), or through any combination thereof. In some embodiments, the one or more communication networks 126 allow for communication using any suitable protocols, like Transmission Control Protocol/Internet Protocol (TCP/IP). In some embodiments, each base station transmitter 105 or receiver system 102 is communicatively coupled to the server 122 via a cellular communication network.

Figure 2A:
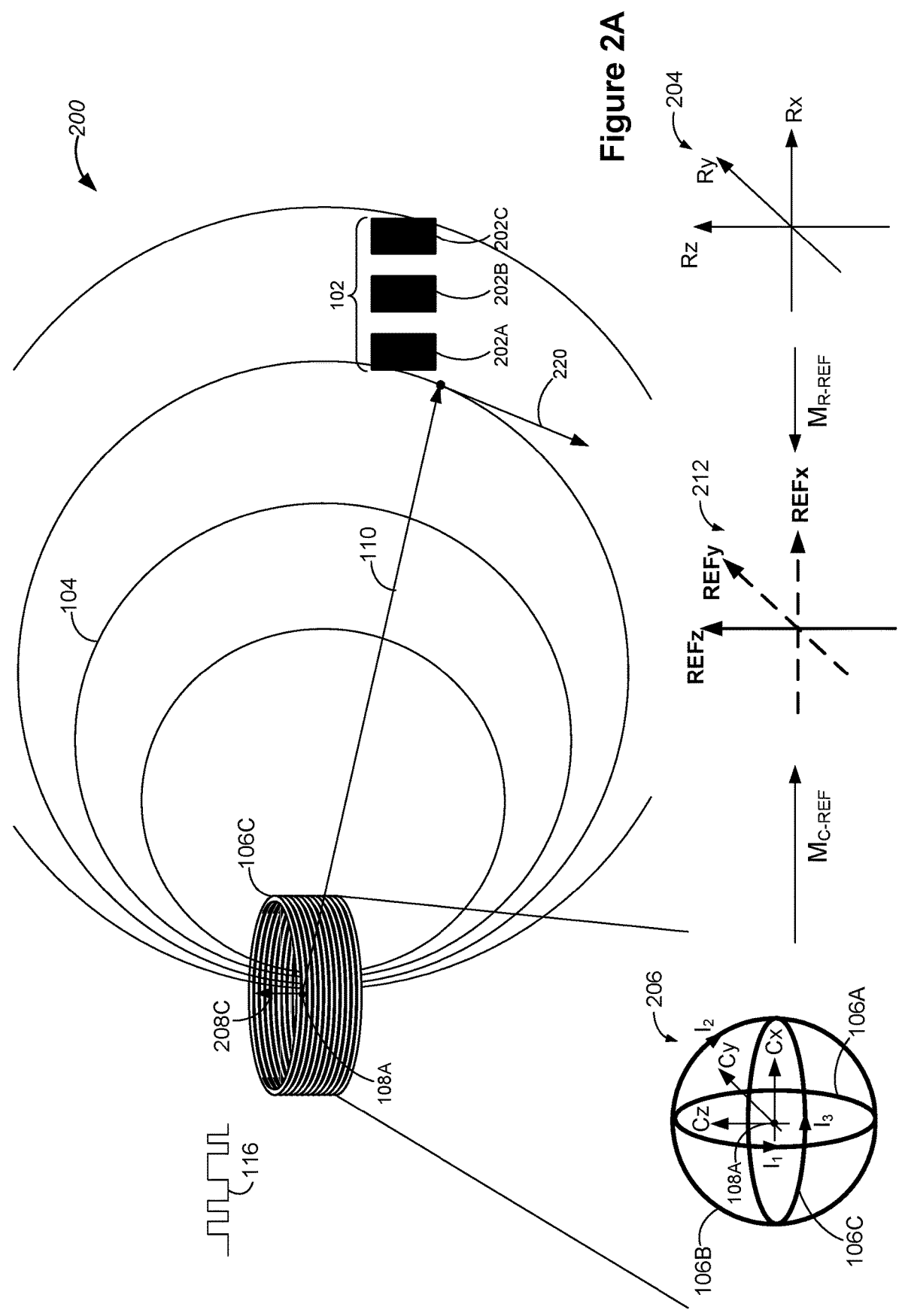
FIG. 2A is a block diagram of an example local positioning system (LPS) including a plurality of wired coils intersecting each other at a first known location in a local positioning environment, in accordance with some embodiments.
Figure 2B:
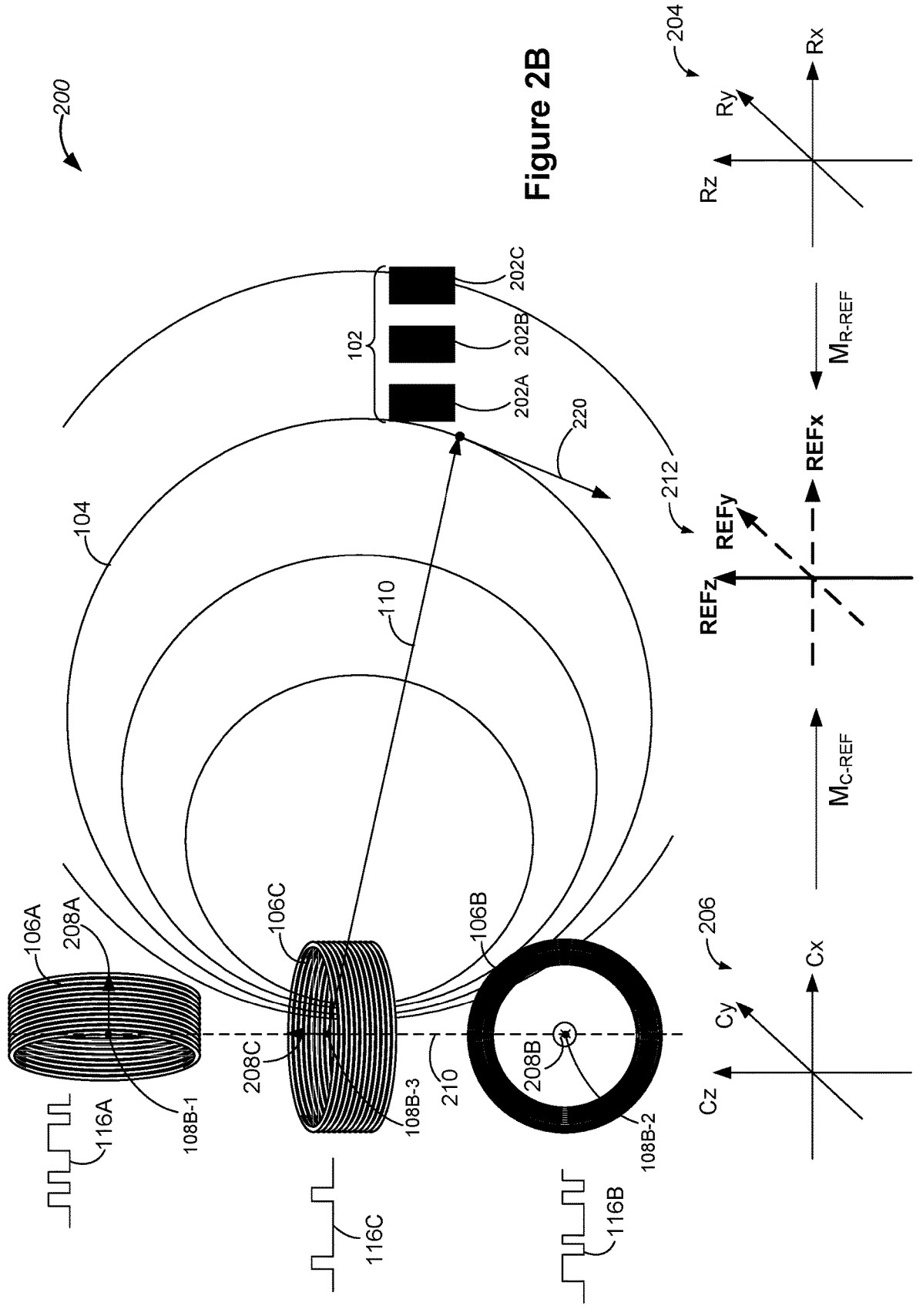
FIG. 2B is a block diagram of another example LPS that includes a plurality of wired coils having centers aligned along a straight line, in accordance with some embodiments.
Figure 2C:
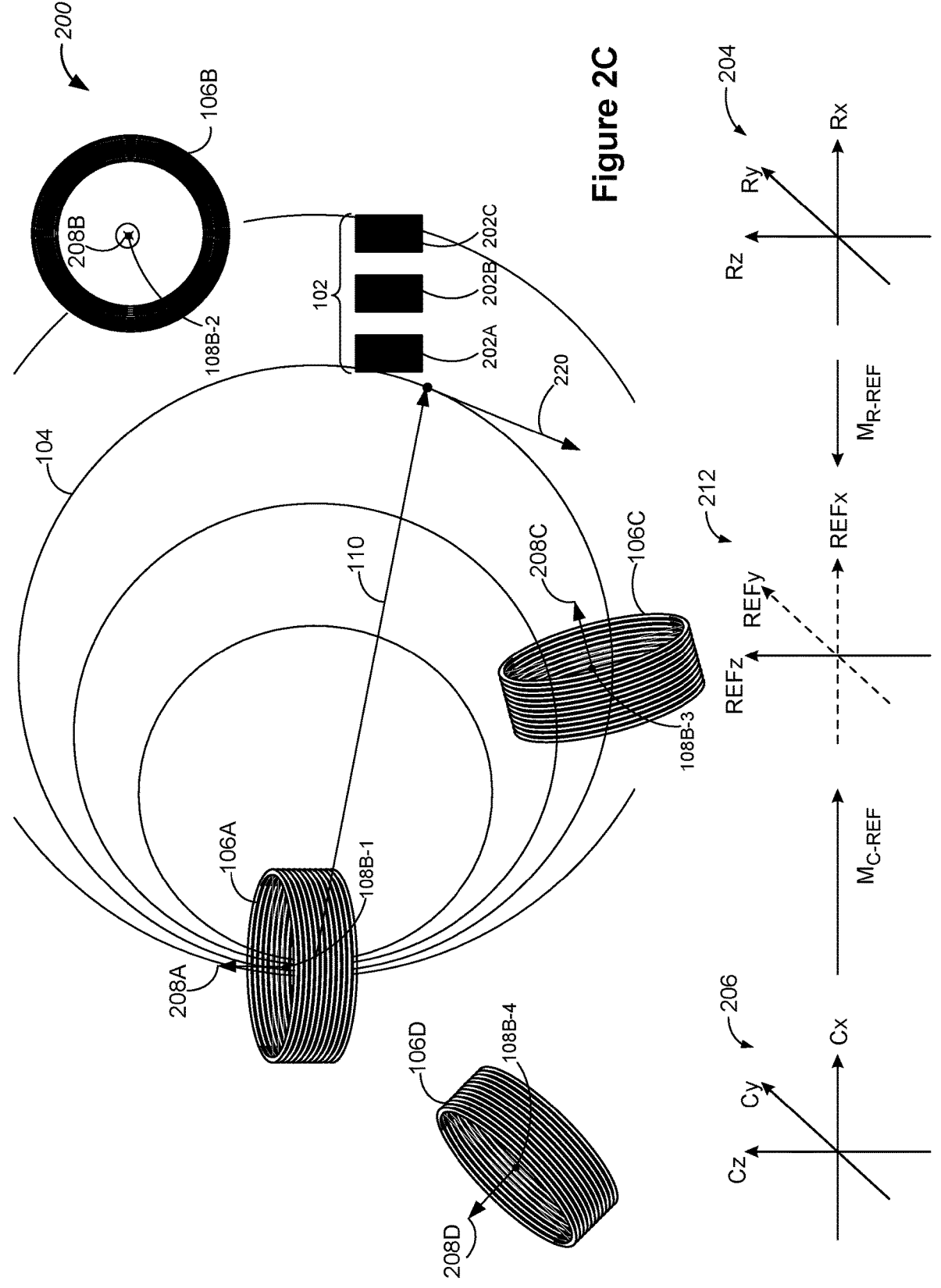
FIG. 2C is a block diagram of an example LPS including a plurality of wired coils distributed in a local positioning environment, in accordance with some embodiments.

FIG. 2A is a block diagram of an example local positioning system (LPS) 200 including a plurality of wired coils 106 (coils 106A, 106B, and 106C) intersecting each other at a first known location 108A in a local positioning environment 100, in accordance with some embodiments. FIG. 2B is a block diagram of another example LPS 200 that includes a plurality of wired coils 106 (coils 106A, 106B, and 106C) having centers aligned along a straight line 210, in accordance with some embodiments. FIG. 2C is a block diagram of an example LPS 200 including a plurality of wired coils 106 (coils 106A, 106B, 106C, and 106D) distributed in a local positioning environment, in accordance with some embodiments. Each LPS system 200 includes a plurality of wire coils 106 and a receiver system 102. The plurality of wire coils 106 create a magnetic field 104 jointly, and the receiver system 102 is located within the magnetic field 104. In each of FIGS. 2A-2C, the magnetic field lines merely illustrate the magnetic field 104 without indicating accurate magnitudes and directions of magnetic field vectors 504 at individual locations.

Each wire coil 106 includes one or more respective turns of wire that have a respective shape (e.g., square, rectangular, or triangular) and a respective size. The respective turns of wire are arranged substantially in parallel with a respective wire plane (e.g., the plane 502 in FIG. 5). Each wire coil 106 is configured to be electrically driven by a respective synchronous electric current (e.g., $I_1$, $I_2$, and $I_3$) carrying a respective train of pseudo-random waveforms 116 according to a predefined bandwidth. For each wire coil 106, the respective train of pseudo-random waveforms 116 includes a first number ($N_1$) of waveform periods and is orthogonal to each other train of pseudo-random waveforms of the wire coils distinct from the respective wire coil 106. In an example, the predefined bandwidth is 50 kHz centered at 500 kHz, and the train of pseudo-random waveforms 116 includes 10,000 waveform periods. In some embodiments, the respective train of pseudo-random waveforms 116 is repeatedly applied to the synchronous electric current of each wire coil 106.

The plurality of wire coils 106 is configured to create the magnetic field 104. The receiver system 102 is coupled to the plurality of wire coils 106 via the magnetic field 104 and configured to measure the magnetic field 104 during each waveform period. Specifically, the receiver system 102 is configured to measure the magnetic field 104 during each waveform period of the first number ($N_1$) of waveform periods (which are optionally successive) and determine a respective magnetic data vector 220 of the magnetic field 104 during each waveform period. The first number of waveform periods corresponds to the first number of magnetic data vectors 220. The receiver system 102 is configured to determine the relative location 110 of the receiver system 102 with reference to the plurality of wire coils 106 using at least a subset of the first number of magnetic data vectors 220. In some embodiments, the receiver system 102 includes a plurality of receiver sensors 202 (e.g., three receiver sensors 202A, 202B, and 202C) configured to measure a plurality of magnetic components of the magnetic field 104 in a receiver coordinate system 204 having a plurality of receiver axes (e.g., Rx, Ry, and Rz). In an example, each of the receiver sensors 202A-202C includes a magnetic sensor configured to measure one of the receiver axes Rx, Ry, and Rz, which are orthogonal to each other.

Referring to FIG. 2A, in some embodiments, three wire coils 106A, 106B, and 106C correspond to three distinct wire planes. The three wire coils 106A, 106B, and 106C optionally have the same size or different sizes, the same shape or different shapes, and the same number or different numbers of turns. In this example, each of the plurality of wire coils 106A-106C is circular and has a predefined diameter. The three distinct wire planes intersect each other, and particularly, are perpendicular to each other and intersect at a common origin node 108A. The magnetic field 104 is measured in a coil coordinate system 206, and the coil coordinate system 206 has an origin located at the common origin node 108A. In this example, the three wire coils 106A, 106B, and 106C are electrically driven by respective synchronous electric currents (e.g., $I_1$, $I_2$, and $I_3$), and create three magnetic dipoles that are located at the common origin node 108A and aligned with three axes Cx, Cy, and Cz of the coil coordinate system 206. In some embodiments, amplitude of the respective synchronous electric currents (e.g., $I_1$, $I_2$, and $I_3$) are equal to each other. Alternatively, in some embodiments, amplitudes of at least two of the respective synchronous electric currents (e.g., $I_1$, $I_2$, and $I_3$) are different from each other. It is noted that in some embodiments, at least two of the respective wire planes of the plurality of wire coils 106 intersect with an angle that is not equal to 90 degrees.

Referring to FIG. 2B, in some embodiments, the three wire coils 106A, 106B, and 106C are electrically driven by respective synchronous electric currents (e.g., $I_1$, $I_2$, and $I_3$), and create three magnetic dipoles 208A, 208B, and 208C at corresponding locations 108B-1, 108B-2, and 108B-3, respectively. The three magnetic dipoles 208A, 208B, and 208C are aligned with three axes Cx, Cy, and Cz of the coil coordinate system 206, respectively. The corresponding locations 108B-1, 108B-2, and 108B-3 of the three wire coils 106A-106C are aligned along the straight line 210.

Referring to FIG. 2C, in some embodiments, the four wire coils 106A-106D are electrically driven by respective synchronous electric currents (e.g., $I_1$, $I_2$, $I_3$, and $I_4$), and create four magnetic dipoles 208A-208D at four distinct locations 108B-1 to 108B-4. The magnetic dipoles 208A and 208B are aligned with axes Cz and Cy of the coil coordinate system 206, respectively. The magnetic dipoles 208C and 208D are oriented to two different directions that are not aligned with any of the axes Cx, Cy, and Cz in the coil coordinate system 206. In an example not shown, the four distinct locations 108B-1 to 108-4 correspond to four corners of a rectangular shape lying on a common plane. Further, in some embodiments, the four magnetic dipoles 208A-208D are parallel to each other and perpendicular to the common plane. Alternatively and additionally, in some embodiments not shown, the four magnetic dipoles 208A-208D are formed on the common plane. Every two of the four magnetic dipoles 208A-208D are optionally parallel to each other or oriented to different directions (e.g., perpendicular to each other) on the common plane.

Referring to FIGS. 2A-2C, during each waveform period, a subset of the plurality of wire coils 106 is driven by the respective synchronous electric currents in accordance with the respective trains of pseudo-random waveforms 116 (e.g., the waveforms 116A, 116B, and 116C in FIG. 2B). The receiver system 102 determines a respective magnetic data vector 220 of the magnetic field 104 created by the subset of the plurality of wire coils 106 at the location where the receiver system 102 is located. The respective magnetic data vector 220 is measured in the receiver coordinate system 204. The receiver system 102 obtains receiver conversion information (e.g., the information 790 in FIG. 7B) for converting vectors in the receiver coordinate system 204 into a reference coordinate system 212. Based on the receiver conversion information, the respective magnetic data vector 220 is converted to the reference coordinate system 212. The magnetic field 104 is known in the coil coordinate system 206 and converted to the reference coordinate system 212 as well. The respective converted magnetic data vector 220 is compared with the converted magnetic field 104 in the reference coordinate system 212 to determine the relative location 110 of the receiver system 102 with reference to the first or second known locations 108 of the plurality of wire coils 106.

In some embodiments, the receiver system 102 further includes a reference sensor (e.g., the sensor 305 in FIG. 3) configured to identify the reference coordinate system 212 with reference to the receiver coordinate system 204. The receiver conversion information includes a receiver conversion matrix for converting vectors in the receiver coordinate system 204 to the reference coordinate system 212. Base conversion information (e.g., the information 740 in FIG. 7A) includes a coil conversion matrix for converting vectors associated with the magnetic field 104 in the coil coordinate system 206 into the reference coordinate system 212. In an example, the reference sensor (e.g., the sensor 305 in FIG. 3) includes a gravity sensor configured to identify a gravity direction –REFz. During each waveform period, the respective magnetic data vector 220 is projected onto the gravity direction –REFz. The magnetic field 104 generated by the respective subset of wire coils 106 is projected onto the gravity direction –REFz. The projected value of the respective magnetic data vector 220 is compared with projected values of the magnetic field 104 (i.e., the projected magnetic field vectors 504 in FIG. 5) at different locations to determine the relative location 110. In some embodiments, more than one location has the same projected value of the magnetic field 104, and more than one waveform period is needed to find a combination of projected values of the respective magnetic data vector 220 to identify the relative location 110. Stated another way, in some embodiments, a second number of waveform periods is applied to determine each relative location 110, and the second number ($N_2$) is both (i) greater than 1 and (ii) equal to or less than the first number ($N_1$) of waveform periods corresponding to each respective train of pseudo-random waveforms (i.e., $1 < N_2 < N_1$).

FIG. 3 is a flow diagram of an example method 300 for localizing a receiver system 102 in a magnetic field 104 created by a base station transmitter 105, in accordance with some embodiments. The base station transmitter 105 includes a plurality of wire coils 106. Each wire coil 106 includes one or more respective turns of wire that have a respective shape and a respective size and are arranged substantially in parallel with a respective wire plane. Each wire coil 106 is electrically driven (302) by a respective synchronous electric current carrying a respective train of pseudo-random waveforms 116 according to a predefined bandwidth. For each wire coil 106, the respective train of pseudo-random waveforms 116 includes a first number ($N_1$) of waveform periods, and is orthogonal to each other train of pseudo-random waveforms of the wire coils distinct from the respective wire coil 106. In some embodiments, the first number ($N_1$) of waveform periods is repeated in the respective train of pseudo-random waveforms 116.

The magnetic field 104 is created by the plurality of wire coils 106 based on the respective train of pseudo-random waveforms 116 of each wire coil 106. In an example, the predefined bandwidth is 50 kHz centered at 500 kHz, and the train of pseudo-random waveforms 116 includes 10,000 waveform periods. The location where the receiver system 102 is located corresponds to a magnetic field vector (e.g., the vector 504 in FIG. 5). When the location of the receiver system 102 is fixed, the magnetic field vector varies with the waveform periods based on the respective train of pseudo-random waveforms 116 of each wire coil 106. When the receiver system 102 moves within the magnetic field, the magnetic field vector measured by the receiver system 102 varies based on both the variation of the location of the receiver system 102 and the respective train of pseudo-random waveforms 116 of each wire coil 106. In some embodiments, given the respective train of pseudo-random waveforms, the magnetic field vector corresponding to the magnetic field 104 is calibrated at a plurality of locations of the coil coordinate system 206 during each waveform period.

In some embodiments, the base station transmitter 105 further includes a coil reference sensor 304 configured to identify the reference coordinate system 212 that is distinct from the coil coordinate system 206. In an example, the coil reference sensor 304 is a gravity sensor configured to identify a gravity direction –REFz. The reference coordinate system 212 includes at least the gravity direction –REFz. In accordance with information provided by the coil reference sensor 304, base conversion information 740 is determined (306) by the base station transmitter 105, a server 122, or the receiver system 102 for converting vectors in the coil coordinate system 206 into the reference coordinate system 212.

In some embodiments, the receiver system 102 includes a plurality of magnetic sensors 202 corresponding to a plurality receiver axes (e.g., Rx, Ry, and Rz) in a receiver coordinate system 204, and is configured to measure (308) a plurality of magnetic components of the magnetic field 104 in the receiver coordinate system 204. The receiver system 102 determines (310) a respective magnetic data vector 220 corresponding to the location of the receiver system 102 in the magnetic field 104 during each waveform period. The respective magnetic data vector 220 includes the plurality of magnetic components in the receiver coordinate system 204. In some embodiments, the receiver system 102 further includes a receiver reference sensor 305 (e.g., a gravity sensor) for identifying the reference coordinate system 212 (e.g., a gravity direction –REFz). The receiver system 102 determines (312) receiver conversion information (e.g., the information 790 in FIG. 7B) for converting vectors in the receiver coordinate system 204 to the reference coordinate system 212. In some embodiments, during the first number ($N_1$) of waveform periods, the receiver system 102 determines the first number ($N_1$) of magnetic data vectors 220 of the magnetic field 104 in the receiver coordinate system 204. A subset of the first number of magnetic data vectors 220 measured in the receiver coordinate system 204 is converted (314) to a set of converted magnetic data vectors 220 in the reference coordinate system 212 using the receiver conversion information. Based on the receiver conversion information, the receiver system 102 determines (316) the relative location 110 of the receiver system 102 with reference to the plurality of wire coils 106 using at least the subset of the first number ($N_1$) of magnetic data vectors 220.

In some embodiments, the base station transmitter 105 provides information about the plurality of wire coils 106 and the base conversion information 740 to the receiver system 102 (e.g., by way of the server 122). For example, the information about the plurality of wire coils includes one or more of: respective synchronous electric currents, shapes, sizes, locations, orientations, and trains of pseudo-random waveforms. The receiver system 102 derives the magnetic field vectors of the magnetic field 104 based on the information about the wire coils. Alternatively, in some embodiments, the magnetic field 104 created by the base station transmitter 105 is actually calibrated in the coil coordinate system 206. The calibrated magnetic field vectors of the magnetic field 104 are provided to the receiver system 102 (e.g., by way of the server 122) with the base conversion information 740. The receiver system 102 projects the derived/calibrated magnetic field vectors of the magnetic field 104 onto the reference coordinate system 212 using the base conversion information 740, thereby mapping (318) the magnetic field vectors of the magnetic field 104 in the reference coordinate system 212. The receiver system 102 measures the first number ($N_1$) of magnetic data vectors 220, projects a subset of magnetic data vectors 220 to the reference coordinate system 212 using the receiver conversion information, and compares each projected magnetic data vector 220 corresponding to a respective waveform period with the mapped magnetic field vectors of the magnetic field 104. Based on a comparison result, the receiver system 102 determines the relative location 110 of the receiver system 102 with reference to the plurality of wire coils 106.

Alternatively, in some embodiments, an equation is constructed based on the information of the plurality of wire coils and the base conversion information 740, and associates the magnetic field vectors of the magnetic field 104 with locations in the reference coordinate system 212. The receiver system 102 applies (320) the equation to determine the relative location of the receiver system 102 based on each projected magnetic data vector 220 corresponding to a respective waveform period.

In some embodiments, the base station transmitter 105 provides the information about the plurality of wire coils, the base conversion information 740, and the calibrated magnetic field vectors of the magnetic field 104 via the server 122. The receiver system 102 provides the subset of the first number of magnetic data vectors 220 and the receiver conversion information to the server 122. In some embodiments, the server 122 determines the relative location of the receiver system 102 by mapping (318) the magnetic field vectors of the magnetic field 104 in the reference coordinate system 212, projecting the subset of the first number magnetic data vectors 220 onto the reference coordinate system 212, and comparing each projected magnetic data vector 220 with the mapped magnetic field vectors of the magnetic field 104. Alternatively, in some embodiments, the server 122 constructs the equation associating the magnetic field vectors of the magnetic field 104 with locations in the reference coordinate system 212, and applies (320) the equation to determine the relative location 110 of the receiver system 102 based on each projected magnetic data vector 220. The server 122 then provides the relative location 110 of the receiver system 102 to the receiver system 102, allowing the receiver system 102 to localizing itself with respect to the plurality of wire coils or in the GCS.

FIG. 4 is a local field map 400 indicating a magnetic field vector projected onto a reference coordinate system 212 (e.g., the gravity direction −REFz), in accordance with some embodiments. The local field map 400 associates each of a plurality of locations in the magnetic field 104 of the wire coils 106 with a respective magnetic field vector 504 (see FIG. 5) in the reference coordinate system 212. Each location in the magnetic field 104 of the wire coils 106 includes a respective distance and a respective direction represented with reference to the wire coils 106. For example, the reference coordinate system 212 is the gravity direction −REFz. The local field map 400 associates each of the plurality of locations in the magnetic field 104 with a magnetic value generated by projecting a corresponding magnetic field vector 504 onto the gravity direction −REFz. Different labels 410 (e.g., labels 410A, 410B, and 410C) represent different wire coils being driven by respective electric currents. For example, the labels 410A, 410B, and 410C represent the magnetic values generated by projecting magnetic field vectors 504 produced by the wire coils 106A, 106B, and 106C in FIG. 2A, respectively.

Figure 7A:
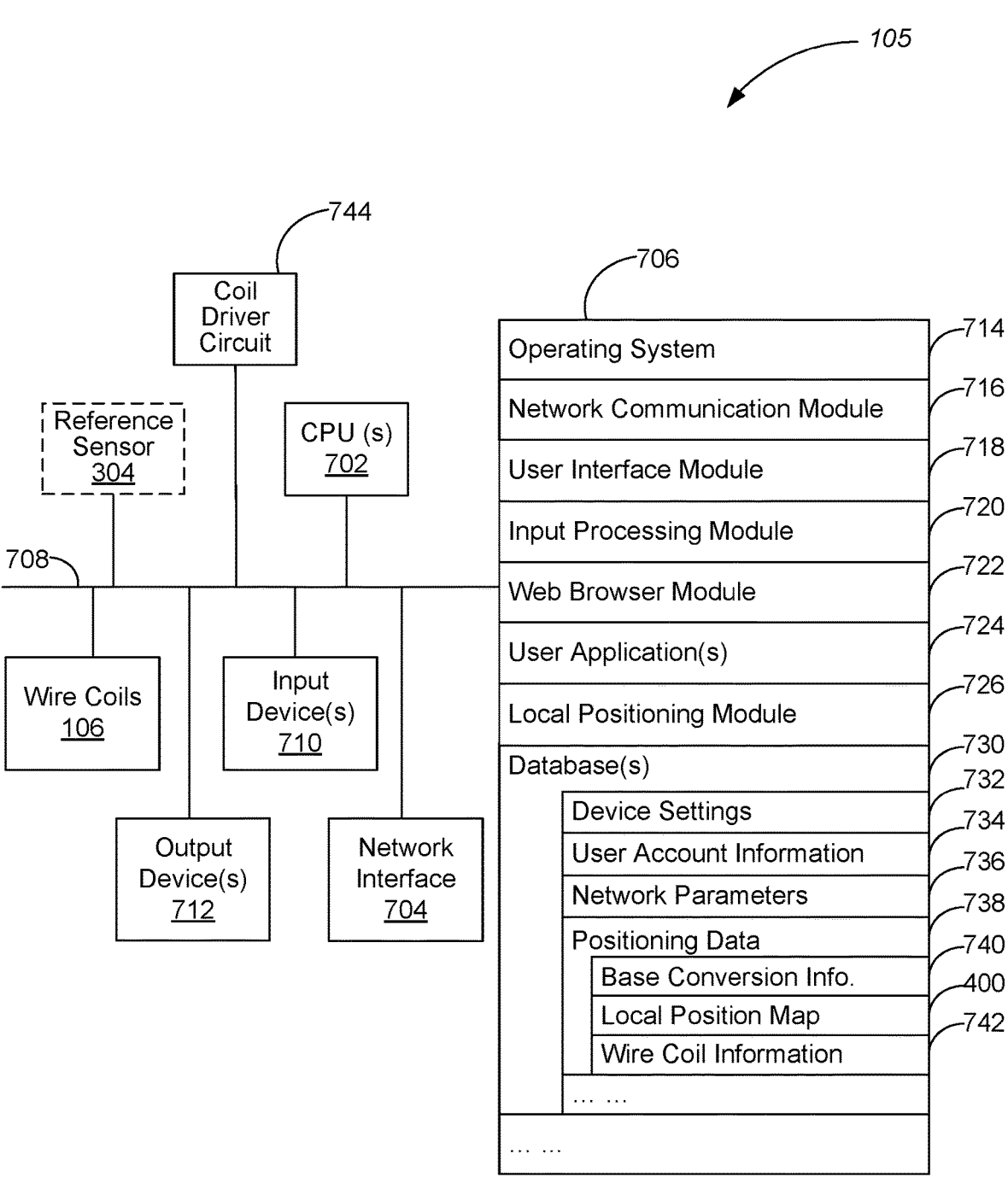
FIG. 7A is a block diagram of a base station transmitter, in accordance with some embodiments. The base station transmitter includes a plurality of wire coils.
Figure 7B:
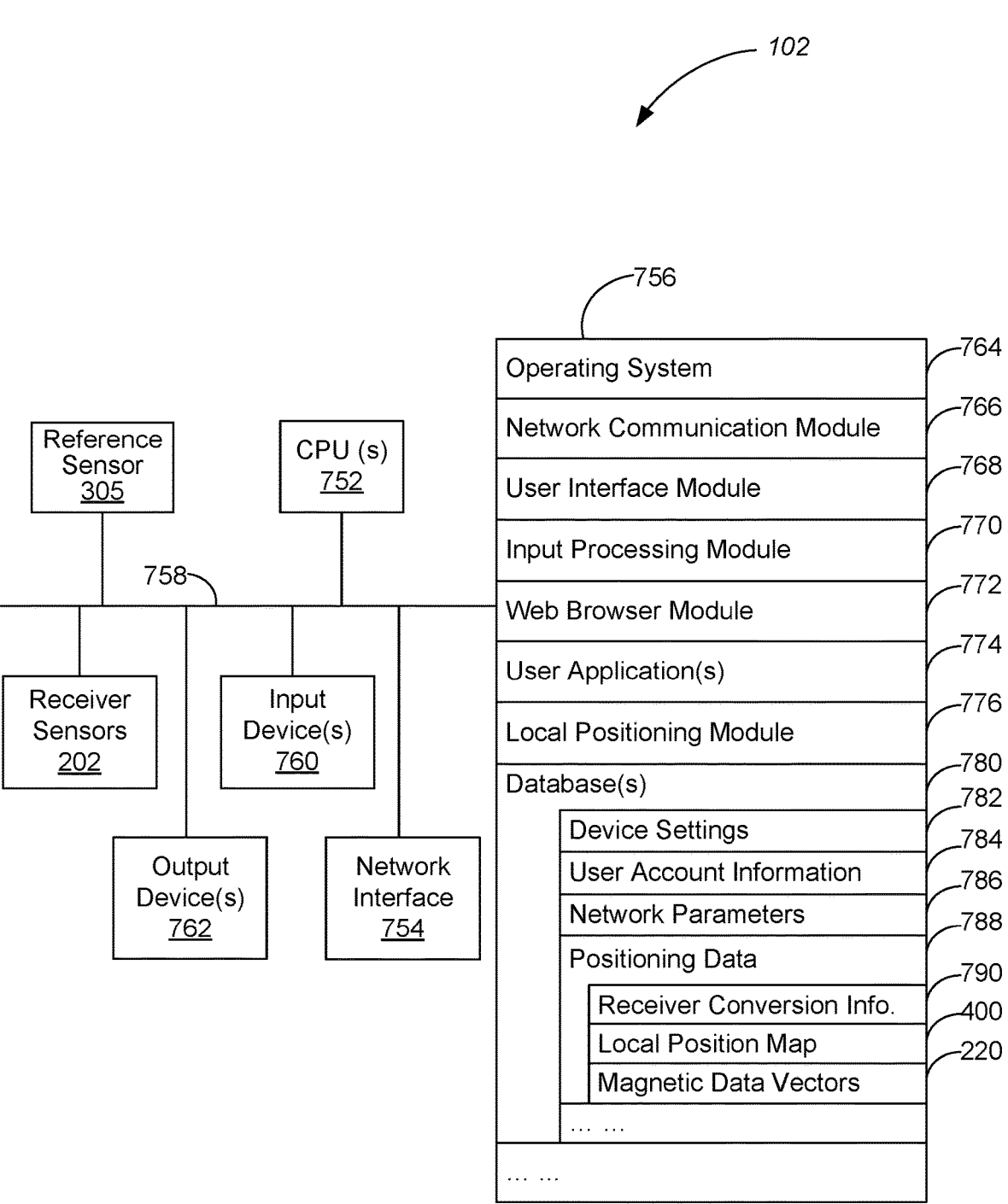
FIG. 7B is a block diagram of a receiver system for determining a location of the receiver system, in accordance with some embodiments.

The relative location 110 of the receiver system 102 is determined based on the local field map 400, the subset of magnetic data vectors 220 measured during the first number ($N_1$) of waveform periods, and the receiver conversion information 790 (see FIG. 7B). The receiver system 102 converts the subset of the first number of magnetic data vectors 220 measured in the receiver coordinate system 204 to a set of converted magnetic data vectors in the reference coordinate system 212 using the receiver conversion information. In some situations, the receiver system 102 identifies the set of converted magnetic data vectors 402 in the local field map 400. The relative location 110A of the receiver system 102 is identified in the local field map 400 using the set of converted magnetic data vectors. Alternatively, in some situations, the receiver system 102 identifies in the local field map 400 a set of mapping magnetic vectors 404 converted from the magnetic field vectors 504. The local field map 400 does not include the set of converted magnetic data vectors 406 generated based on the magnetic data vectors 220, and the set of converted magnetic data vectors 406 are substantially close to, and are interpolated from, the set of mapping magnetic vectors 404. The relative location 110B of the receiver system 102 is interpolated from a set of relative locations corresponding to the set of mapping magnetic vectors 404 in the local field map. In some situations, the set of mapping magnetic vectors 404 is determined based on the same wire coil 106 in different waveform periods. Alternatively, in some situations, the set of mapping magnetic vectors 404 is determined based on two or more wire coils 106 during different waveform periods.

In some embodiments, the local field map 400 is calibrated and provided to the receiver system 102. For each of a plurality of drive combinations of the wire coils 106, the base station transmitter 105 or server 122 determines one or more magnetic field vectors 504 (see FIG. 5) at the plurality of locations in the magnetic field 104 of the wire coils 106 in the coil coordinate system 206 and projects the one or more magnetic field vectors to the reference coordinate system 204 to generate a respective magnetic vector. The local field map 400 is determined to associate each of a plurality of locations in the magnetic field 104 of the wire coils 106 with the respective magnetic field vector 504 projected to the reference coordinate system 204.

Figure 5:
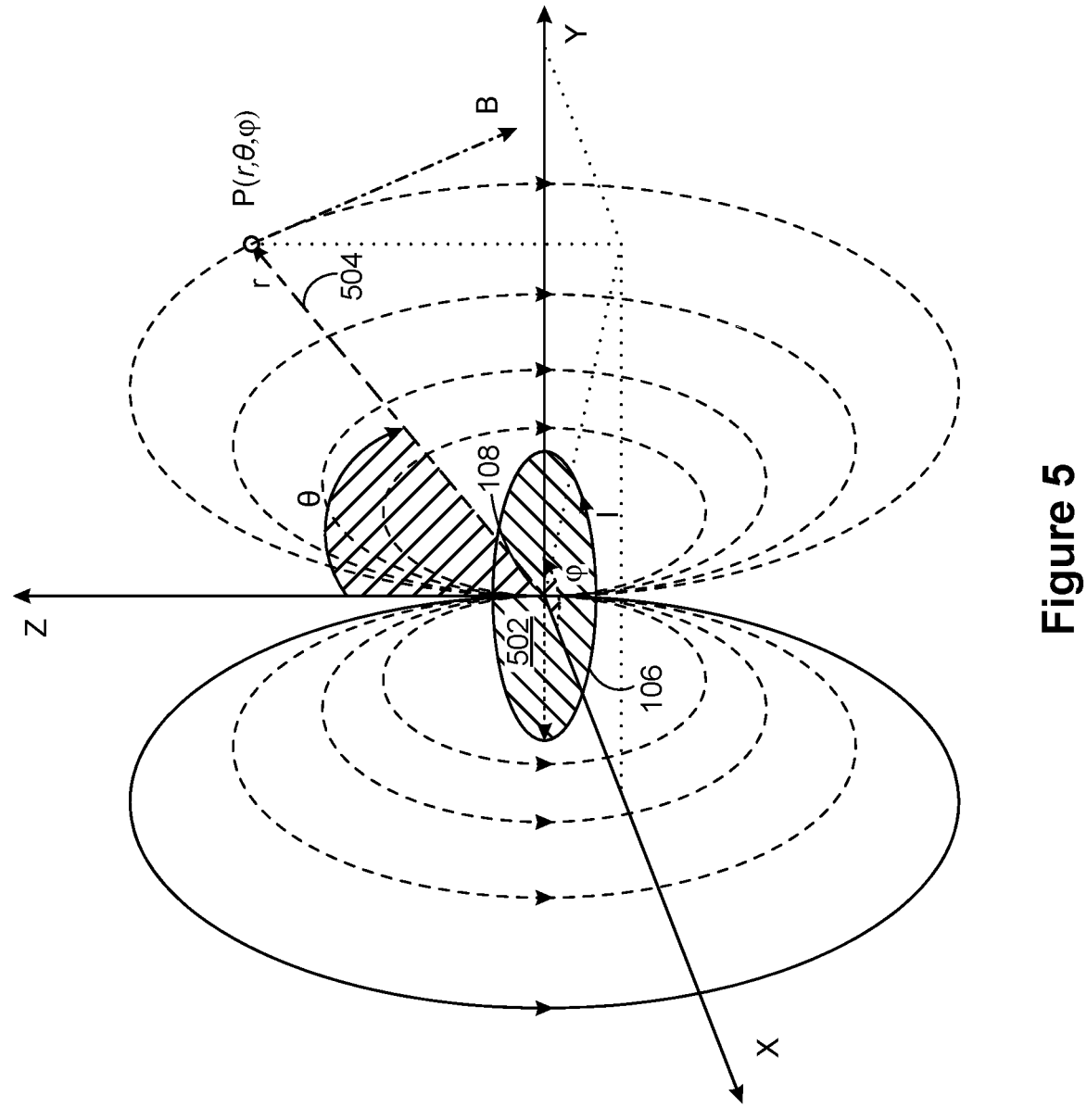
FIG. 5 is a diagram of an example magnetic field of a wire coil, in accordance with some embodiments.

FIG. 5 is a diagram of an example magnetic field of a wire coil 106, in accordance with some embodiments. The wire coil 106 includes one or more respective turns of wire that have a circular shape and a radius R and are arranged substantially in parallel with a respective wire plane 502. The circular shape has a center at a location 108. The wire coil 106 is electrically driven by a respective synchronous electric current I carrying a respective train of pseudo-random waveforms 116 according to a predefined bandwidth. Stated another way, the electric current I is turned on and off according to the train of pseudo-random waveforms 116, and the train of pseudo-random waveforms 116 includes a first number of waveform periods modulated according to a frequency in the predefined bandwidth (e.g., a bandwidth of 50 kHz having a center frequency of 500 kHz).

In some embodiments, the wire coil 106 creates a magnetic field 104 in a coil coordinate system 206 having an origin at the center of the wire coil 106 (i.e., at the location 108). The coil coordinate system 206 includes three spherical coordinates (r, θ, φ). A magnetic field vector 504 of the magnetic field 104 is represented with a radial distance r, a polar angle θ, and an azimuthal angle φ in the coil coordinate system 206. Particularly, the magnetic field vector 504 (B) of the magnetic field 104 has three components ($B_r$, $B_θ$, and $B_φ$) represented as follows:

$$B_r = \frac{\mu_0 NIS}{2\pi r^3}\cos\theta \qquad (1)$$

$$B_\theta = \frac{\mu_0 NIS}{2\pi r^3}\sin\theta \qquad (2)$$

$$B_\varphi = 0 \qquad (3)$$

where N is a number of turns of wire, I is the electric current, S is an area of the circular shape, and $\mu_0$ is a permeability of vacuum and equal to $4\pi \times 10^{-3}$ Gm/A. In some embodiments, the wire coil 106 does not have a magnetic core and generates a magnetic dipole moment M=NIS, and M is aligned with the central axis of the wire coil 106.

In an example, the reference coordinate system 212 includes the gravity direction −REFz (i.e., −z axis in FIG. 5). The magnetic field vector 504 (B) of the magnetic field 104 is projected to the gravity direction −REFz as follows:

$$B_{-REFz} = -\frac{\mu_0 NIS}{2\pi r^3}\cos\theta\,\cos\theta + \frac{\mu_0 NIS}{2\pi r^3}\sin\theta\,\sin\theta = -\frac{\mu_0 NIS}{2\pi r^3}\cos2\theta \qquad (4)$$

By these means, the magnetic field vector 504 (B) is projected onto the reference coordinate system 212, while being associated with the location (r, θ, φ) of the receiver system 102 in the coil coordinate system 206. During each waveform period, the magnetic data vector 220 is projected onto the reference coordinate system 212 and compared with the projected magnetic field vector 504 (B) at different locations in the reference coordinate system 212. When the magnetic data vector 220 projected onto the reference coordinate system 212 matches one of the projected magnetic field vector 504 (B), the location (r, θ, φ) associated with the projected magnetic field vector 504 (B) is determined as the location of the receiver system 102 in the coil coordinate system 206. In some embodiments (e.g., associated with FIG. 2C), the magnetic field 104 is complex and a computer model is applied to determine the magnetic field vector 504 (B) projected onto the reference coordinate system 212.

In some situations, during a first waveform period, the magnetic data vector 220 projected onto the reference coordinate system 212 matches a plurality of projected magnetic field vectors 504 (B). The magnetic data vector 220 is monitored during one or more subsequent waveform periods to select one of the plurality of projected magnetic field vectors 504 (B). The location (r, θ, φ) associated with the selected one of the plurality of projected magnetic field vectors 504 (B) is determined as the location of the receiver system 102 in the coil coordinate system 206.

Figures 6A, 6B:
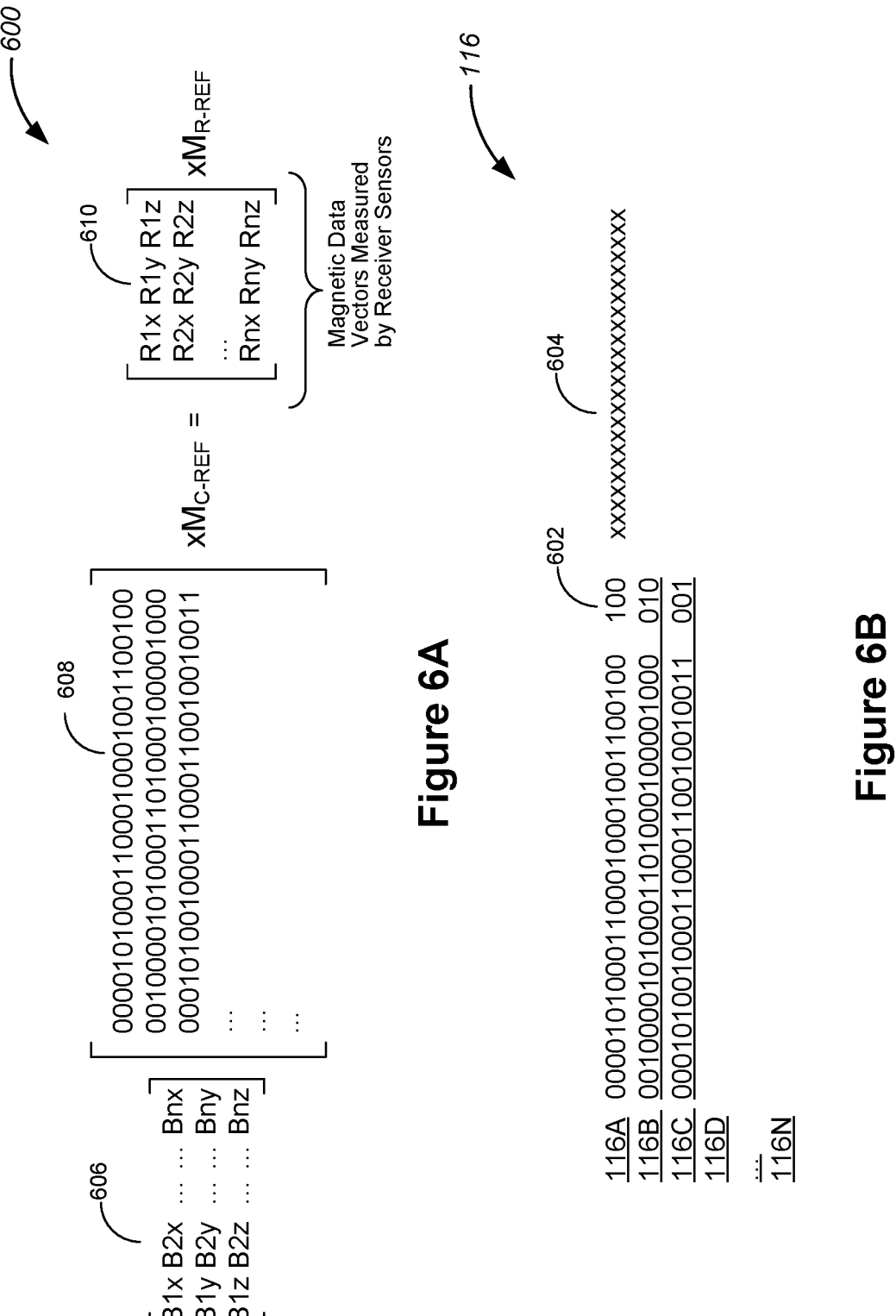
FIG. 6A illustrates an example matrix equation including magnetic data vectors, in accordance with some embodiments.
FIG. 6B illustrates a plurality of trains of pseudo-random waveforms carried by electric currents that drive a plurality of wire coils, in accordance with some embodiments.

FIG. 6A illustrates an example matrix equation 600 including magnetic data vectors 220, in accordance with some embodiments, and FIG. 6B illustrates a plurality of trains of pseudo-random waveforms 116 carried by electric currents that drive a plurality of wire coils 106, in accordance with some embodiments. The LPS 200 has a plurality of wire coils 106. Each wire coil 106 is configured to be electrically driven by a respective synchronous electric current I carrying a respective train of pseudo-random waveforms 116 according to a predefined bandwidth. In some embodiments, the respective train of pseudo-random waveforms 116 includes a train of pseudo-random pulses. Each pulse is a rectangular pulse, a triangular pulse, a raised cosine pulse, a Sinc pulse, or a Gaussian pulse. Each pulse is triggered with the predefined bandwidth of a frequency (e.g., a bandwidth of 50 kHz at a center frequency of 500 kHz) and with a predefined phase. The respective train of pseudo-random waveforms 116 includes a first number (N₁) of waveform periods and is orthogonal to each other train of pseudo-random waveforms of the wire coils distinct from the respective wire coil 106. In some embodiments, the first number (N₁) of waveform periods is repeated successively in the respective train of pseudo-random waveforms 116. Alternatively, in some embodiments, the first number (N₁) of waveform periods is followed with integrity data 602 in the respective train of pseudo-random waveforms 116. In an example, the integrity data 602 includes an even parity bit. In some embodiments, the first number (N₁) of waveform periods is followed with or follow a supplemental communication message 604. In an example, the supplemental communication message 604 is inserted between two repeated trains of pseudo-random waveforms 116.

In some situations, when the plurality of wire coils 106 are orthogonal to each other, only one of the plurality of wire coil 106 is driven by the respective synchronous electric current during each of the first number (N₁) of waveform periods. Each location in the magnetic field 104 corresponds to the first number (N₁) of magnetic field vectors 504 during the first number of waveform periods. In some embodiments, during a first waveform period, only a first wire coil 106A is driven by a first electric current h. The magnetic data vector 220 is measured by the receiver system 102, projected to the reference coordinate system 212, and applied to identify more than one magnetic field vectors 504 corresponding to more than one locations that may be symmetric with respect to the first wire coil 106A. During a second waveform period following the first waveform period, only a second wire coil 106B is driven by a second electric current b. The locations that are symmetric with respect to the first wire coil 106A are not symmetric with respect to the second wire coil 106B, and the corresponding magnetic field vectors 504 projected onto the reference coordinate system 212 are not equal. When the magnetic data vector 220 is measured during the second waveform period, the magnetic data vector 220 projected onto the reference coordinate system 212 is used to select one of the multiple locations determined during the first waveform period as the location of the receiver system 102.

Stated another way, in some embodiments, a subset of the first number of magnetic data vectors 220 measured during a subset of the first number of waveform periods is applied to determine the relative location 110 of the receiver system 102. Each of the first number of magnetic data vectors 220 is associated with a set of respective magnetic field vectors 504 corresponding to a set of respective related locations with reference to a respective wire coil 106. Respective related locations of the subset of the first number of magnetic data vectors 220 are compared to identify the relative location 110, which overlaps or is substantially close to a location in each set of respective related locations.

Further, in some embodiments, a location of the magnetic field 104 corresponds to a respective magnetic field vector 504 created by each of the plurality of wire coils 106. Magnetic components of respective magnetic field vectors 504 of the plurality of wire coils 106 are combined to generate a magnetic field matrix 606. Respective trains of pseudo-random waveforms 116 driving the plurality of wire coils 106 are combined to generate a matrix of pseudo-random data 608. The base conversion information 740 for converting vectors from the coil coordinate system 206 to the reference coordinate system 212 includes a base conversion matrix MC-REF. During each waveform period, a magnetic data vector 220 is measured and includes a plurality of magnetic components. The magnetic components of the magnetic data vectors 220 measured from a subset of waveform periods are combined to generate a magnetic data matrix 610. The receiver conversion information 790 for converting vectors from the receiver coordinate system 204 to the reference coordinate system 212 includes a receiver conversion matrix MR-REF. The matrixes 606-610, MC-REF, and MR-REF form the matrix equation 600.

In some embodiments, the magnetic field matrix 606 includes the magnetic components of respective magnetic field vectors 504 of the plurality of wire coils 106, and the magnetic field matrix 606 is expressed as functions of the location of the receiver system 102 (e.g., r, θ, and φ in equations (1)-(4)). The matrixes 608, 610, MC-REF, and MR-REF are known. The matrix equation 600 is solved to determine the magnetic field matrix 606, and the magnetic field matrix 606 is then used to determine the location of the receiver system 102 in the coil reference system 206, i.e., with reference to the wire coils 106.

FIG. 7A is a block diagram of a base station transmitter 105, in accordance with some embodiments. The base station transmitter 105 includes a plurality of wire coils 106. The base station transmitter 105 typically includes one or more processing units (CPUs) 702, one or more network interfaces 704, memory 706, and one or more communication buses 708 for interconnecting these components (sometimes called a chipset). The base station transmitter 105 includes one or more input devices 710 that facilitate user input, such as a keyboard, a mouse, a voice-command input unit or microphone, a touch screen display, a touch-sensitive input pad, a gesture capturing camera, or other input buttons or controls. The base station transmitter 105 also includes one or more output devices 712, which enable presentation of user interfaces and display content, including one or more speakers and/or one or more visual displays. In some embodiments, the base station transmitter 105 includes a location detection device, such as a GPS or other geolocation receiver, for determining the location of the base station transmitter 105. In some embodiments, the base station transmitter 105 includes a coil reference sensor 304 for identifying a reference coordinate system 212.

The memory 706 includes high-speed random access memory, such as DRAM, SRAM, DDR RAM, or other random access solid state memory devices. In some embodiments, the memory includes non-volatile memory, such as one or more magnetic disk storage devices, one or more optical disk storage devices, one or more flash memory devices, or one or more other non-volatile solid state storage devices. In some embodiments, the memory 706 includes one or more storage devices remotely located from one or more processing units 702. The memory 706, or alternatively the non-volatile memory within the memory 706, includes a non-transitory computer readable storage medium. In some embodiments, the memory 706, or the non-transitory computer readable storage medium of the memory 706, stores the following programs, modules, and data structures, or a subset or superset thereof:

- an operating system 714, including procedures for handling various basic system services and for performing hardware dependent tasks;
- a network communication module 716, which connects the base station transmitter 105 to other devices (e.g., a server 122, a client device 124, a base station transmitter 105, or a receiver system 102) via one or more network interfaces 704 (wired or wireless) and one or more communication networks 126, such as the Internet, other wide area networks, local area networks, metropolitan area networks, and so on;
- a user interface module 718, which enables presentation of information (e.g., a graphical user interface for application(s) 724, widgets, websites and web pages thereof, games, audio content, video content, and/or text) via one or more output devices 712 (e.g., displays or speakers);
- an input processing module 720, which detects one or more user inputs or interactions from one of the one or more input devices 710 and interprets the detected input or interaction;
- a web browser module 722, which navigates, requests (e.g., via HTTP), and displays websites and web pages thereof, including a web interface for logging into a user account associated with the base station transmitter 105, controlling the base station transmitter 105 if it is associated with the user account, and editing and reviewing settings and data that are associated with the user account;
- one or more user applications 724, which are executed by the base station transmitter 105 (e.g., games, social network applications, smart home applications, and/or other web or non-web based applications for controlling another electronic device and reviewing data captured by such devices);
- a local positioning module 726, which provides a plurality of trains of pseudo-random waveforms 116 to drive the plurality of wire coils 106. In some embodiments, the integrity data 602 and supplemental communication messages 604 are provided with the trains of pseudo-random waveforms 116; and
- one or more databases 730, which store data including one or more of:
  - device settings 732, including common device settings (e.g., service tier, device model, storage capacity, processing capabilities, and/or communication capabilities) of the base station transmitter 105;
  - user account information 734 for the one or more user applications 724 (e.g., user names, security questions, account history data, user preferences, and predefined account settings);
  - network parameters 736 for the one or more communication networks 126 (e.g., IP address, subnet mask, default gateway, DNS server, and host name); and
  - positioning data 738 including, but not limited to, base conversion information 740, a local field map 400 of the magnetic field 104 created by the wire coils 106, and/or wire coil information 742 (e.g., respective synchronous electric currents, shapes, sizes, locations, orientations, and trains of pseudo-random waveforms).

In some embodiments, the base station transmitter 105 includes a coil driver circuit 744 coupled to the local positioning module 726 and each wire coil 106. The coil driver circuit 744 is configured to generate a respective synchronous electric current I carrying the respective train of pseudo-random waveforms and provide the respective electric current to drive a corresponding wire coil 106.

Each of the above identified elements may be stored in one or more of the previously mentioned memory devices, and corresponds to a set of instructions for performing a function described above. The above identified modules or programs (i.e., sets of instructions) need not be implemented as separate software programs, procedures, modules or data structures, and thus various subsets of these modules may be combined or otherwise re-arranged in various embodiments.

In some embodiments, the memory 706 stores a subset of the modules and data structures identified above. In some embodiments, the memory 706 stores additional modules and data structures not described above.

FIG. 7B is a block diagram of a receiver system 102 for determining the location of the receiver system 102, in accordance with some embodiments. The receiver system 102 includes a plurality of receiver sensors 202 (e.g., magnetic sensors) configured to measure a plurality of magnetic components of a magnetic field 104 in a receiver coordinate system 204 having a plurality of receiver axes (e.g., Rx, Ry, and Rz). The receiver system 102 typically includes one or more processing units (CPUs) 752, one or more network interfaces 754, memory 756, and one or more communication buses 758 for interconnecting these components (sometimes called a chipset). The receiver system 102 includes one or more input devices 760 that facilitate user input, such as a keyboard, a mouse, a voice-command input unit or microphone, a touch screen display, a touch-sensitive input pad, a gesture capturing camera, or other input buttons or controls. The receiver system 102 also includes one or more output devices 762, which enable presentation of user interfaces and display content, including one or more speakers and/or one or more visual displays. In some embodiments, the receiver system 102 includes a location detection device, such as a GPS (global positioning system) or other geolocation receiver, for determining the location of the receiver system 102. In some embodiments, the receiver system 102 includes a reference sensor 305 for identifying a reference coordinate system 212.

The memory 756 includes high-speed random access memory, such as DRAM, SRAM, DDR RAM, or other random access solid state memory devices. In some embodiments, the memory includes non-volatile memory, such as one or more magnetic disk storage devices, one or more optical disk storage devices, one or more flash memory devices, or one or more other non-volatile solid state storage devices. In some embodiments, the memory 756 includes one or more storage devices remotely located from one or more processing units 752. The memory 756, or alternatively the non-volatile memory within the memory 756, includes a non-transitory computer readable storage medium. In some embodiments, the memory 756, or the non-transitory computer readable storage medium of memory 756, stores the following programs, modules, and data structures, or a subset or superset thereof:

- an operating system 764, including procedures for handling various basic system services and for performing hardware dependent tasks;
- a network communication module 766, which connects the receiver system 102 to other devices (e.g., a server 122, a client device 124, a base station transmitter 105, or a receiver system 102) via one or more network interfaces 754 (wired or wireless) and one or more communication networks 126, such as the Internet, other wide area networks, local area networks, metropolitan area networks, and so on;
- a user interface module 768, which enables presentation of information (e.g., a graphical user interface for application(s) 774, widgets, websites and web pages thereof, games, audio content, video content, and/or text) via one or more output devices 762 (e.g., displays or speakers);
- an input processing module 770, which detects one or more user inputs or interactions from one of the one or more input devices 760 and interprets the detected input or interaction;

- a web browser module 772, which navigates, requests (e.g., via HTTP), and displays websites and web pages thereof, including a web interface for logging into a user account associated with the receiver system 102, controlling the receiver system 102 if associated with the user account, and editing and reviewing settings and data that are associated with the user account;
- one or more user applications 774, which are executed by the receiver system 102 (e.g., games, social network applications, smart home applications, and/or other web or non-web based applications for controlling another electronic device and reviewing data captured by such devices);
- a local positioning module 776, which determines the relative location 110 of the receiver system 102 with reference to the plurality of wire coils 106 using at least a subset of magnetic data vectors 220 measured by the plurality of receiver sensors 202; and
- one or more databases 780, which store data, including one or more of:
  - device settings 782, including common device settings (e.g., service tier, device model, storage capacity, processing capabilities, and/or communication capabilities) of the receiver system 102;
  - user account information 784 for the one or more user applications 774 (e.g., user names, security questions, account history data, user preferences, and predefined account settings);
  - network parameters 786 for the one or more communication networks 126 (e.g., IP address, subnet mask, default gateway, DNS server and host name); and
  - positioning data 788, including, but not limited to, receiver conversion information 790, a local field map 400 of a magnetic field 104 created by a plurality of wire coils 106, and/or magnetic data vectors 220 measured by the magnetic sensors 202.

Each of the above identified elements may be stored in one or more of the previously mentioned memory devices, and corresponds to a set of instructions for performing a function described above. The above identified modules or programs (i.e., sets of instructions) need not be implemented as separate software programs, procedures, modules or data structures, and thus various subsets of these modules may be combined or otherwise re-arranged in various embodiments. In some embodiments, the memory 756 stores a subset of the modules and data structures identified above. In some embodiments, the memory 756 stores additional modules and data structures not described above.

FIG. 8 is a flow diagram of an example method 800 for providing an LPS 200, in accordance with some embodiments. The method 800 incudes providing (802) a plurality of wire coils 106. Each wire coil 106 includes one or more respective turns of wire that have a respective shape and a respective size and are arranged substantially in parallel with a respective wire plane 502. Each wire coil 106 is configured (804) to be electrically driven by a respective synchronous electric current carrying a respective train of pseudo-random waveforms 116 according to a predefined bandwidth. For each wire coil 106, the respective train of pseudo-random waveforms 116 includes (806) a first number of waveform periods and is orthogonal to each other train of pseudo-random waveforms 116 of the wire coils 106 distinct from the respective wire coil. In some embodiments, the respective train of pseudo-random waveforms 116 includes a train of pseudo-random pulses. Each pulse is a rectangular pulse, a triangular pulse, a raised cosine pulse, a Sinc pulse, or a Gaussian pulse, and the train of pseudo-random pulses is repeated every first number of bits. In some embodiments, the plurality of wire coils 106 is integrated into a base station transmitter 105 of the LPS 200. The base station transmitter 105 is moveable. As the base station transmitter 105 is moved to a location 108, the base station transmitter 105 creates a magnetic field 104 in a region including and surrounding the location 108. In some embodiments, the wire coils 106 are distributed to a plurality of locations 108B (e.g. as shown in FIGS. 2B and 2C), and the base station transmitter 105 creates a magnetic field 104 in a region including the plurality of locations 108B.

Referring FIG. 2A, in some embodiments, the plurality of wire coils 106 include (808) three identical wire coils 106 having the same shape and the same size. Respective wire planes 502 of the plurality of wire coils 106 are perpendicular to each other and intersect at a common origin node 108. Respective dipole axes of the plurality of wire coils 106 are perpendicular to each other and intersect at the common origin node 108.

In some embodiments, at least two of the respective wire planes 502 intersect with an angle that is not equal to 90 degrees.

In some embodiments, each of the plurality of wire coils 106 is circular and has a predefined diameter.

In some embodiments, at least one of the plurality of wire coils 106 is configured (810) to transmit a supplemental communication message 604 (see FIG. 6B), and the supplemental communication message 604 is inserted between two repeated trains of pseudo-random waveforms 116.

In some embodiments, the predefined bandwidth is below a frequency threshold. The magnetic field 104 can be substantially stabilized at a frequency in the predefined bandwidth. In some embodiments, the frequency threshold is limited by dynamics of a radiator.

In some embodiments, a controller is coupled to the plurality of wire coils 106. The controller is provided (812) to determine the accuracy level of a global positioning system (GPS) at the location where the plurality of wire coils 106 is located, and when the accuracy level is lower than an accuracy requirement, the controller enables driving each of the plurality of wire coils 106 with the respective synchronous electric current.

In some embodiments, each wire coil 106 is configured to transmit (814) integrity data 602 with the respective train of pseudo-random waveforms 116 according to the predefined bandwidth. For example, the integrity data 602 immediately follows each train of pseudo-random waveforms 116.

In some embodiments, amplitudes of respective synchronous electric currents of the plurality of wire coils 106 are set independently of each other.

In some embodiments, amplitudes of respective synchronous electric currents of the plurality of wire coils 106 are equal to each other.

In some embodiments, the plurality of wire coils 106 is configured to create a magnetic field 104. The method 800 further includes providing (816) a receiver system 102 coupled to the plurality of wire coils 106 via the magnetic field 104 of the plurality of wire coils 106. In some embodiments, the receiver system 102 is configured (818) to measure the magnetic field 104 during each waveform period. Further, in some embodiments, the receiver system 102 is configured to determine the relative location 110 of the receiver system 102 with reference to the plurality of wire coils 106 based on the magnetic field 104 measured during each waveform period, obtain a base geographical location 112 of the plurality of wire coils 106, and determine the geographical location 114 of the receiver system 102 based on the relative location 110 of the receiver system 102 and the base geographical location 112 of the plurality of wire coils 106.

Additionally, in some embodiments, the receiver system 102 includes a plurality of receiver sensors configured to measure a plurality of magnetic components of the magnetic field 104 in a receiver coordinate system 204 having a plurality of receiver axes. The receiver system 102 is configured to determine a respective magnetic data vector 220 of the magnetic field 104 in the receiver coordinate system 204 during each waveform period. The first number of waveform periods corresponds to the first number of magnetic data vectors 220. Each magnetic data vector 220 includes the plurality of magnetic components projected to the plurality of receiver axes. The receiver system 102 is configured to obtain receiver conversion information 790 for converting vectors in the receiver coordinate system 204 into a reference coordinate system 212, and based on the receiver conversion information 790, determine a relative location 110 of the receiver system 102 with reference to the plurality of wire coils 106 using at least a subset of the first number of magnetic data vectors 220.

In some embodiments, the receiver system 102 further includes a reference sensor 305 configured to identify the reference coordinate system 212, and the receiver conversion information 790 includes a receiver conversion matrix MR-REF for converting vectors in the receiver coordinate system 204 to the reference coordinate system 212. A coil conversion matrix MC-REF is used to convert vectors in a coil coordinate system 206 to the reference coordinate system 212.

In some embodiments, the receiver system 102 is configured to convert the subset of the first number of magnetic data vectors 220 measured in the receiver coordinate system 204 to a set of converted magnetic data vectors 220 in the reference coordinate system 212. This uses the receiver conversion information 790 and the relative location 110 of the receiver system 102 with reference to the plurality of wire coils 106, and is determined based on the set of converted magnetic data vectors 220 in the reference coordinate system 212.

In some embodiments, the receiver system 102 is configured to obtain a local field map 400 associating each of a plurality of locations in the magnetic field 104 of the wire coils 106 with a respective magnetic field vector 504 in a reference coordinate system 212. Each location in the magnetic field 104 of the wire coils 106 includes a respective distance and a respective direction represented with reference to the wire coils 106. The relative location of the receiver system 102 is determined based on the local field map 400, the subset of the first number of magnetic data vectors 220, and the receiver conversion information 790.

Additionally, in some embodiments (see FIG. 4), the receiver system 102 is configured to convert the subset of the first number of magnetic data vectors 220 measured in the receiver coordinate system 204 to a set of converted magnetic data vectors 220 in the reference coordinate system 212 using the receiver conversion information 790. The receiver system 102 is configured to identify the set of converted magnetic data vectors 220 in the local field map 400. The relative location 110 of the receiver system 102 is identified in the local field map 400 using the set of converted magnetic data vectors. The receiver system 102 is also configured to identify in the local field map 400 a set of mapping magnetic vectors 404. The local field map 400 does not include the set of converted magnetic data vectors 220, and the set of converted magnetic data vectors 220 are substantially close to, and are interpolated from, the set of mapping magnetic vectors 404. The relative location 110 of the receiver system 102 is interpolated from a set of relative locations 110 corresponding to the set of mapping magnetic vectors 404 in the local field map 400.

Further, in some embodiments, the base station transmitter 105 includes the wire coils 106. The base station transmitter 105 or a server 122 is configured to provide the local field map 400 by, for each of a plurality of drive combinations of the wire coils 106, determining one or more magnetic field vectors 504 at the plurality of locations in the magnetic field 104 of the wire coils 106 in a coil coordinate system 206, projecting the one or more magnetic field vectors 504 onto the reference coordinate system 212 to generate a projected magnetic field vector, and determining the local field map 400 associating each of a plurality of locations in the magnetic field 104 of the wire coils 106 with the respective magnetic field vector 504 (also called a mapping magnetic vector) in the reference coordinate system 212.

FIG. 9 is a flow diagram of another example method for determining a position of a receiver system 102 in an LPS 200, in accordance with some embodiments. In some embodiments, the method is applied at a receiver system 102 of a robotic system, a vehicle, or a mobile phone. For convenience, the method 900 is described as being implemented by a receiver system 102. In some embodiments, the method 900 is governed by instructions that are stored in a non-transitory computer readable storage medium and that are executed by one or more processors of the electronic system. Each of the operations shown in FIG. 9 may correspond to instructions stored in a computer memory or non-transitory computer readable storage medium. The computer readable storage medium may include a magnetic or optical disk storage device, solid state storage devices such as Flash memory, or other non-volatile memory device or devices. The instructions stored on the computer readable storage medium may include one or more of: source code, assembly language code, object code, or other instruction format that is interpreted by one or more processors. Some operations in method 900 may be combined and/or the order of some operations may be changed.

The receiver system 102 is coupled (902) in a magnetic field 104 created by a plurality of wire coils 106. The magnetic field 104 is generated (904) by the plurality of wire coils 106, each of which is driven by a respective synchronous electric current carrying a respective train of pseudo-random waveforms 116 according to a predefined bandwidth. In some embodiments, the respective synchronous electric current carries the respective train of pseudo-random waveforms 116 according to a predefined phase. For each wire coil, the respective train of pseudo-random waveforms 116 includes (906) the first number of waveform periods and is orthogonal to each other train of pseudo-random waveforms of the wire coils 106 distinct from the respective wire coil. The receiver system 102 measures (908) the magnetic field 104 during each waveform period of a first number ($N_1$) of waveform periods (which are optionally successive). The receiver system 102 determines (910) a respective magnetic data vector 220 of the magnetic field 104 during each waveform period. The first number of waveform periods correspond (912) to the first number ($N_1$) of magnetic data vectors 220. The receiver system 102 determines (914) the relative location 110 of the receiver system 102 with reference to the plurality of wire coils 106 using at least a subset of the first number ($N_1$) of magnetic data vectors 220.

In some embodiments, the receiver system 102 obtains (916) a base geographical location 112 of the plurality of wire coils 106 and determines (918) the geographical location 114 of the receiver system 102 based on the relative location 110 of the receiver system 102 and the base geographical location 112 of the plurality of wire coils 106.

In some embodiments, the receiver system 102 includes (920) a plurality of receiver sensors configured to measure a plurality of magnetic components of the magnetic field 104 in a receiver coordinate system 204 having a plurality of receiver axes (e.g., Rx, Ry, and Rz). During each waveform period, the respective magnetic data vector 220, including the plurality of magnetic components, is projected onto the plurality of receiver axes. Further, in some embodiments, the receiver system 102 obtains receiver conversion information 790 for converting each magnetic data vector 220 in the receiver coordinate system 204 to a reference coordinate system 212 (e.g., including a gravity direction). Based on the receiver conversion information 790, the receiver system 102 determines the relative location 110 of the receiver system 102 with reference to the plurality of wire coils 106 using at least a subset of the first number of magnetic data vectors 220.

In some embodiments, the receiver system 102 further includes (922) a reference sensor configured to identify the reference coordinate system 212, and the receiver conversion information 790 includes a receiver conversion matrix MR-REF for converting vectors in the receiver coordinate system 204 to the reference coordinate system 212 and a coil conversion matrix MC-REF for converting vectors in a coil coordinate system 206 to the reference coordinate system 212.

In some embodiments, the receiver system 102 converts (924) the subset of the first number of magnetic data vectors 220 measured in the receiver coordinate system 204 to a set of converted magnetic data vectors 220 in the reference coordinate system 212 using the receiver conversion information 790. The relative location 110 of the receiver system 102 with reference to the plurality of wire coils 106 is determined based on the set of converted magnetic data vectors 220 in the reference coordinate system 212.

In some embodiments, the receiver system 102 obtains a local field map 400 associating each of a plurality of locations in the magnetic field 104 of the wire coils 106 with a respective magnetic field vector 504 in a reference coordinate system 212. Each location in the magnetic field 104 of the wire coils 106 includes a respective distance and a respective direction represented with reference to the wire coils 106. The relative location 110 of the receiver system 102 is determined based on the local field map 400, the subset of the first number of magnetic data vectors 220, and the receiver conversion information 790. Further, in some embodiments, the receiver system 102 converts the subset of the first number of magnetic data vectors 220 measured in the receiver coordinate system 204 to a set of converted magnetic data vectors 220 in the reference coordinate system 212 using the receiver conversion information 790. In some embodiments, the receiver system 102 identifies the set of converted magnetic data vectors 220 in the local field map 400, and the relative location 110 of the receiver system 102 is identified in the local field map 400 using the set of converted magnetic data vector. In some embodiments, the receiver system 102 identifies in the local field map 400 a set of mapping magnetic vectors 406. The local field map 400 does not include the set of converted magnetic data vectors 220, and the set of converted magnetic data vectors 220 is substantially close to, and are interpolated from, the set of mapping magnetic vectors 406. The relative location 110 of the receiver system 102 is interpolated from a set of relative locations 110 corresponding to the set of mapping magnetic vectors 406 in the local field map 400.

Additionally, in some embodiments, a base station transmitter 105 includes the wire coils 106. The base station transmitter 105 or a server 122 is configured to provide the local field map 400. For each of a plurality of drive combinations of the wire coils 106, the base station transmitter 105 or server 102 determines one or more magnetic field vectors 504 at the plurality of locations in the magnetic field 104 of the wire coils 106 in a coil coordinate system 206, projects the one or more magnetic field vectors 504 onto the reference coordinate system 212 to generate a projected magnetic field vector 504, and determines the local field map 400 associating each of a plurality of locations in the magnetic field 104 of the wire coils 106 with the projected magnetic field vector 504 (also called mapping magnetic vector) in the reference coordinate system 212.

It should be understood that the particular order in which the operations in FIG. 9 have been described is merely exemplary and are not intended to indicate that the described order is the only order in which the operations could be performed. One of ordinary skill in the art would recognize various ways to adjust the process described herein. Additionally, it should be noted that details of other processes described above with respect to FIGS. 1-8 are also applicable in an analogous manner to the method 900 described above with respect to FIG. 9. For brevity, these details are not repeated here.

Some implementations of this applications are described in the following clauses:

Clause 1: A system for local positioning, comprising: a plurality of wire coils, each wire coil including one or more respective turns of wire that have a respective shape and a respective size and are arranged substantially in parallel with a respective wire plane, wherein: each wire coil is configured to be electrically driven by a respective synchronous electric current carrying a respective train of pseudo-random waveforms according to a predefined bandwidth; and for each wire coil, the respective train of pseudo-random waveforms includes a first number of waveform periods and is orthogonal to each other train of pseudo-random waveforms of the wire coils distinct from the respective wire coil.

Clause 2: The system of clause 1, wherein the plurality of wire coils are configured to create a magnetic field, the system further comprising: a receiver system coupled to the plurality of wire coils via the magnetic field of the plurality of wire coils, wherein the receiver system is configured to measure the magnetic field during each waveform period.

Clause 3: The system of clause 2, wherein the receiver system is configured to: determine a relative location of the receiver system with reference to the plurality of wire coils based on the magnetic field measured during each waveform period; obtain a base geographical location of the plurality of wire coils; and determine a geographical location of the receiver system based on the relative location of the receiver system and the base geographical location of the plurality of wire coils.

Clause 4: The system of clause 2 or 3, wherein the receiver system includes a plurality of receiver sensors configured to measure a plurality of magnetic components of the magnetic field in a receiver coordinate system having a plurality of receiver axes, and is configured to: determine a respective magnetic data vector of the magnetic field in the receiver coordinate system during each waveform period, the first number of waveform periods corresponding to the first number of magnetic data vectors, each magnetic data vector including the plurality of magnetic components projected onto the plurality of receiver axes; obtain receiver conversion information for converting vectors in the receiver coordinate system into a reference coordinate system; and based on the receiver conversion information, determine a relative location of the receiver system with reference to the plurality of wire coils using at least a subset of the first number of magnetic data vectors.

Clause 5: The system of clause 4, wherein the receiver system further includes a reference sensor configured to identify the reference coordinate system, and the receiver conversion information includes a receiver conversion matrix for converting vectors in the receiver coordinate system to the reference coordinate system, and wherein a coil conversion matrix is used to convert vectors in a coil coordinate system to the reference coordinate system.

Clause 6: The system of clause 4, wherein the receiver system is configured to convert the subset of the first number of magnetic data vectors measured in the receiver coordinate system to a set of converted magnetic data vectors in the reference coordinate system using the receiver conversion information, and the relative location of the receiver system with reference to the plurality of wire coils is determined based on the set of converted magnetic data vectors in the reference coordinate system.

Clause 7: The system of clause 4, wherein the receiver system is configured to: obtain a local field map associating each of a plurality of locations in the magnetic field of the wire coils with a respective magnetic vector in a reference coordinate system, each location in the magnetic field of the wire coils including a respective distance and a respective direction represented with reference to the wire coils; wherein the relative location of the receiver system is determined based on the local field map, the subset of the first number of magnetic data vectors, and the receiver conversion information.

Clause 8: The system of clause 7, wherein the receiver system is configured to convert the subset of the first number of magnetic data vectors measured in the receiver coordinate system to a set of converted magnetic data vectors in the reference coordinate system using the receiver conversion information, and implement one of: identifying the set of converted magnetic data vectors in the local field map, wherein the relative location of the receiver system is identified in the local field map using the set of converted magnetic data vector; or identifying in the local field map a set of mapping magnetic vectors, wherein the local field map does not include the set of converted magnetic data vectors, and the set of converted magnetic data vectors is substantially close to, and is interpolated from, the set of mapping magnetic vectors, wherein the relative location of the receiver system is interpolated from a set of relative locations corresponding to the set of mapping magnetic data vectors in the local field map.

Clause 9: The system of clause 7, wherein a base station including the wire coils or a server system is configured to provide the local field map by, for each of a plurality of drive combinations of the wire coils: determining one or more magnetic field vectors at the plurality of locations in the magnetic field of the wire coils in a coil coordinate system; projecting the one or more magnetic field vectors to the reference coordinate system to generate a projected magnetic field vector; and determining the local field map associating each of a plurality of locations in the magnetic field of the wire coils with the respective magnetic field vector in the reference coordinate system.

Clause 10: The system of any of clauses 1-9, wherein: the plurality of wire coils includes three identical wire coils having a same shape and a same size; respective wire planes of the plurality of wire coils are perpendicular to each other and intersect at a common origin node; and respective dipole axes of the plurality of wire coils are perpendicular to each other and intersect at the common origin node.

Clause 11: The system of any of clauses 1-10, wherein at least two of the respective wire planes intersect with an angle that is not equal to 90 degrees.

Clause 12: The system of any of clauses 1-11, wherein each of the plurality of wire coils is circular and has a predefined diameter.

Clause 13: The system of any of clauses 1-12, wherein: at least one of the plurality of wire coils is configured to transmit a supplemental communication message; and the supplemental communication message is inserted between two repeated trains of pseudo-random waveforms.

Clause 14: The system of any of clauses 1-13, wherein the predefined bandwidth is below a frequency threshold.

Clause 15: The system of any of clauses 1-14, further comprising a controller coupled to the plurality of wire coils, the controller configured to: determine an accuracy level of a global positioning system (GPS) in a region surrounding the plurality of wire coils; and in accordance with a determination that the accuracy level is lower than an accuracy requirement, enabling driving each of the plurality of wire coils with the respective synchronous electric current.

Clause 16: The system of any of clauses 1-15, wherein each wire coil is configured to transmit integrity data with the respective train of pseudo-random waveforms according to the predefined bandwidth.

Clause 17: The system of any of clauses 1-16, wherein amplitudes of respective synchronous electric currents of the plurality of wire coils are set independently of each other.

Clause 18: The system of any of claim 17, wherein amplitudes of respective synchronous electric currents of the plurality of wire coils are equal to each other.

Clause 19: A system for local positioning system, comprising: a receiver system coupled in a magnetic field of a plurality of wire coils, wherein the receiver system is configured to: measure the magnetic field during each waveform period of a first number of waveform periods; determine a respective magnetic data vector of the magnetic field during each waveform period, the first number of waveform periods corresponding to the first number of magnetic data vectors; and determine a relative location of the receiver system with reference to the plurality of wire coils using at least a subset of the first number of magnetic data vectors; wherein the magnetic field is generated by the plurality of wire coils, each of which is configured to be driven by a respective synchronous electric current carrying a respective train of pseudo-random waveforms according to a predefined bandwidth, and for each wire coil, the respective train of pseudo-random waveforms includes the first number of waveform periods and is orthogonal to each other train of pseudo-random waveforms of the wire coils distinct from the respective wire coil.

Clause 20: The system of clause 19, wherein the receiver system is configured to: obtain a base geographical location of the plurality of wire coils; and determine a geographical location of the receiver system based on the relative location of the receiver system and the base geographical location of the plurality of wire coils.

Clause 21: The system of clause 19 or 20, wherein: the receiver system includes a plurality of receiver sensors configured to measure a plurality of magnetic components of the magnetic field in a receiver coordinate system having a plurality of receiver axes; during each waveform period, the respective magnetic data vector includes the plurality of magnetic components projected onto the plurality of receiver axes.

Clause 22: The system of any of clauses 19-21, wherein the receiver system is configured to: obtain receiver conversion information for converting each magnetic data vector in the receiver coordinate system to a reference coordinate system; wherein based on the receiver conversion information, the relative location of the receiver system is determined with reference to the plurality of wire coils using at least a subset of the first number of magnetic data vectors.

Clause 23: The system of any of clauses 19-22, wherein the receiver system further includes a reference sensor configured to identify the reference coordinate system, and the receiver conversion information includes a receiver conversion matrix for converting vectors in the receiver coordinate system to the reference coordinate system and a coil conversion matrix for converting vectors in a coil coordinate system to the reference coordinate system.

Clause 24: The system of any of clauses 19-23, wherein the receiver system is configured to convert the subset of the first number of magnetic data vectors measured in the receiver coordinate system to a set of converted magnetic data vectors in the reference coordinate system using the receiver conversion information, and the relative location of the receiver system with reference to the plurality of wire coils is determined based on the set of converted magnetic data vectors in the reference coordinate system.

Clause 25: The system of any of clauses 19-24, wherein the receiver system is configured to: obtain a local field map associating each of a plurality of locations in the magnetic field of the wire coils with a respective magnetic vector in a reference coordinate system, each location in the magnetic field of the wire coils including a respective distance and a respective direction represented with reference to the wire coils; wherein the relative location of the receiver system is determined based on the local field map, the subset of the first number of magnetic data vectors, and the receiver conversion information.

Clause 26: The system of clause 25, wherein the receiver system is configured to convert the subset of the first number of magnetic data vectors measured in the receiver coordinate system to a set of converted magnetic data vectors in the reference coordinate system using the receiver conversion information, and implement one of: identifying the set of converted magnetic data vectors in the local field map, wherein the relative location of the receiver system is identified in the local field map using the set of converted magnetic data vector; or identifying in the local field map a set of mapping magnetic vectors, wherein the local field map does not include the set of converted magnetic data vectors, and the set of converted magnetic data vectors is substantially close to, and is interpolated from, the set of mapping magnetic vectors, wherein the relative location of the receiver system is interpolated from a set of relative locations corresponding to the set of mapping magnetic data vectors in the local field map.

Clause 27: The system of clause 25, wherein a base station including the wire coils or a server system is configured to provide the local field map by, for each of a plurality of drive combinations of the wire coils: determining one or more magnetic field vectors at the plurality of locations in the magnetic field of the wire coils in a coil coordinate system; projecting the one or more magnetic field vectors to the reference coordinate system to generate a projected magnetic field vector; and determining the local field map associating each of a plurality of locations in the magnetic field of the wire coils with the respective magnetic field vector in the reference coordinate system.

Clause 28: A method for providing a local positioning system, comprising: providing a plurality of wire coils, each wire coil including one or more respective turns of wire that have a respective shape and a respective size and are arranged substantially in parallel with a respective wire plane, wherein: each wire coil is configured to be electrically driven by a respective synchronous electric current carrying a respective train of pseudo-random waveforms according to a predefined bandwidth; and for each wire coil, the respective train of pseudo-random waveforms includes a first number of waveform periods and is orthogonal to each other train of pseudo-random waveforms of the wire coils distinct from the respective wire coil.

Clause 29: A method, for providing a local positioning system in any of the methods of clauses 2-27.

Clause 30: A method for local positioning, comprising: at a receiver system coupled in a magnetic field of a plurality of wire coils: measuring the magnetic field during each waveform period of a first number of waveform periods; determining a respective magnetic data vector of the magnetic field during each waveform period, the first number of waveform periods corresponding to the first number of magnetic data vectors; and determining a relative location of the receiver system with reference to the plurality of wire coils using at least a subset of the first number of magnetic data vectors; wherein the magnetic field is generated by the plurality of wire coils each of which is driven by a respective synchronous electric current carrying a respective train of pseudo-random waveforms according to a predefined bandwidth, and for each wire coil, the respective train of pseudo-random waveforms includes the first number of waveform periods and is orthogonal to each other train of pseudo-random waveforms of the wire coils distinct from the respective wire coil.

The terminology used in the description of the various described implementations herein is for the purpose of describing particular implementations only and is not intended to be limiting. As used in the description of the various described implementations and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof. Additionally, it will be understood that, although the terms "first," "second," etc. may be used herein to describe various elements, these elements should not be limited by these terms. These terms are only used to distinguish one element from another.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software, or any combination thereof.

What is claimed is:

1. A system for local positioning, comprising:
a plurality of wire coils, each respective wire coil including one or more respective turns of wire, wherein:
each wire coil is configured to be electrically driven by a respective synchronous electric current carrying a respective train of pseudo-random waveforms; and
for each wire coil, the respective train of pseudo-random waveforms includes a first number of waveform periods and is orthogonal to each other train of pseudo-random waveforms of the wire coils distinct from the respective wire coil; and
a receiver system coupled to the plurality of wire coils via a magnetic field of the plurality of wire coils, wherein the receiver system is configured to:
determine a respective magnetic data vector of the magnetic field in a receiver coordinate system during each waveform period, the first number of waveform periods corresponding to the first number of magnetic data vectors;
obtain receiver conversion information for converting vectors in the receiver coordinate system into a reference coordinate system;
obtain a local field map associating each of a plurality of locations in the magnetic field of the wire coils with a respective magnetic vector in a reference coordinate system, each location in the magnetic field of the wire coils including a respective distance and a respective direction represented with reference to the wire coils; and
determine a relative location of the receiver system with reference to the plurality of wire coils using the local field map, a subset of the first number of magnetic data vectors, and the receiver conversion information.

2. The system of claim 1, wherein:
for each wire coil, the one or more respective turns of wire have a respective shape and a respective size, and are arranged substantially in parallel with a respective wire plane; and
the receiver system is configured to measure the magnetic field during each waveform period.

3. The system of claim 1, wherein the receiver system is configured to:

determine a relative location of the receiver system with reference to the plurality of wire coils based on the magnetic field measured during each waveform period;

obtain a base geographical location of the plurality of wire coils; and determine a geographical location of the receiver system based on the relative location of the receiver system and the base geographical location of the plurality of wire coils.

4. The system of claim 1, wherein the receiver system includes a plurality of receiver sensors configured to measure a plurality of magnetic components of the magnetic field in a receiver coordinate system having a plurality of receiver axes, and each magnetic data vector including the plurality of magnetic components projected onto the plurality of receiver axes.

5. The system of claim 4, wherein the receiver system further includes a reference sensor configured to identify the reference coordinate system, and the receiver conversion information includes a receiver conversion matrix for converting vectors in the receiver coordinate system to the reference coordinate system, and wherein a coil conversion matrix is used to convert vectors in a coil coordinate system to the reference coordinate system.

6. The system of claim 4, wherein the receiver system is configured to convert the subset of the first number of magnetic data vectors measured in the receiver coordinate system to a set of converted magnetic data vectors in the reference coordinate system using the receiver conversion information, and the relative location of the receiver system with reference to the plurality of wire coils is determined based on the set of converted magnetic data vectors in the reference coordinate system.

7. The system of claim 1, wherein the receiver system is configured to:

convert the subset of the first number of magnetic data vectors measured in the receiver coordinate system to a set of converted magnetic data vectors in the reference coordinate system using the receiver conversion information; and identify the set of converted magnetic data vectors in the local field map, wherein the relative location of the receiver system is identified in the local field map using the set of converted magnetic data vector.

8. The system of claim 1, wherein a base station including the wire coils or a server system is configured to provide the local field map by, for each of a plurality of drive combinations of the wire coils:

determining one or more magnetic field vectors at the plurality of locations in the magnetic field of the wire coils in a coil coordinate system;

projecting the one or more magnetic field vectors to the reference coordinate system to generate a projected magnetic field vector; and determining the local field map associating each of a plurality of locations in the magnetic field of the wire coils with the respective magnetic field vector in the reference coordinate system.

9. The system of claim 1, wherein:

the plurality of wire coils includes three identical wire coils having a same shape and a same size;

for each wire coil, the one or more respective turns of wire are arranged substantially in parallel with a respective wire plane, and respective wire planes of the plurality of wire coils are perpendicular to each other and intersect at a common origin node; and respective dipole axes of the plurality of wire coils are perpendicular to each other and intersect at the common origin node.

10. The system of claim 1, wherein for each wire coil, the one or more respective turns of wire are arranged substantially in parallel with a respective wire plane, and at least two of the respective wire planes intersect with an angle that is not equal to 90 degrees.

11. The system of claim 1, wherein each of the plurality of wire coils is circular and has a predefined diameter.

12. The system of claim 1, wherein:

at least one of the plurality of wire coils is configured to transmit a supplemental communication message; and the supplemental communication message is inserted between two repeated trains of pseudo-random waveforms.

13. The system of claim 1, wherein for each wire coil, the respective synchronous electric current is configured to the respective train of pseudo-random waveforms according to a predefined bandwidth that is below a frequency threshold.

14. The system of claim 1, further comprising a controller coupled to the plurality of wire coils, the controller configured to:

determine an accuracy level of a global positioning system (GPS) in a region surrounding the plurality of wire coils; and in accordance with a determination that the accuracy level is lower than an accuracy requirement, enabling driving each of the plurality of wire coils with the respective synchronous electric current.

15. The system of claim 1, wherein each wire coil is configured to transmit integrity data with the respective train of pseudo-random waveforms.

16. The system of claim 1, wherein amplitudes of respective synchronous electric currents of the plurality of wire coils are set independently of each other.

17. The system of claim 1, wherein amplitudes of respective synchronous electric currents of the plurality of wire coils are equal to each other.

18. The system of claim 1, wherein the receiver system is configured to:

convert the subset of the first number of magnetic data vectors measured in the receiver coordinate system to a set of converted magnetic data vectors in the reference coordinate system using the receiver conversion information; and identify in the local field map a set of mapping magnetic vectors, wherein the local field map does not include the set of converted magnetic data vectors, and the set of converted magnetic data vectors is substantially close to, and is interpolated from, the set of mapping magnetic vectors, wherein the relative location of the receiver system is interpolated from a set of relative locations corresponding to the set of mapping magnetic data vectors in the local field map.

19. A method for providing a local positioning system, comprising:

providing a plurality of wire coils, each respective wire coil including one or more respective turns of wire, wherein:

each wire coil is configured to be electrically driven by a respective synchronous electric current carrying a respective train of pseudo-random waveforms; and for each wire coil, the respective train of pseudo-random waveforms includes a first number of waveform periods and is orthogonal to each other train of pseudo-random waveforms of the wire coils distinct from the respective wire coil; and providing a receiver system coupled to the plurality of wire coils via a magnetic field of the plurality of wire coils, wherein the receiver system is configured to:

determine a respective magnetic data vector of the magnetic field in a receiver coordinate system during each waveform period, the first number of waveform periods corresponding to the first number of magnetic data vectors;

obtain receiver conversion information for converting vectors in the receiver coordinate system into a reference coordinate system;

obtain a local field map associating each of a plurality of locations in the magnetic field of the wire coils with a respective magnetic vector in a reference coordinate system, each location in the magnetic field of the wire coils including a respective distance and a respective direction represented with reference to the wire coils; and determine a relative location of the receiver system with reference to the plurality of wire coils using the local field map, a subset of the first number of magnetic data vectors, and the receiver conversion information.

20. A method for local positioning, comprising:

at a receiver system coupled in a magnetic field of a plurality of wire coils:

measuring the magnetic field during each waveform period of a first number of waveform periods;

determining a respective magnetic data vector of the magnetic field in a receiver coordinate system during each waveform period, the first number of waveform periods corresponding to the first number of magnetic data vectors;

obtaining receiver conversion information for converting vectors in a receiver coordinate system into a reference coordinate system;

obtaining a local field map associating each of a plurality of locations in the magnetic field of the wire coils with a respective magnetic vector in the reference coordinate system, each location in the magnetic field of the wire coils including a respective distance and a respective direction represented with reference to the wire coils; and determining a relative location of the receiver system with reference to the plurality of wire coils using at least the local field map, a subset of the first number of magnetic data vectors, and the receiver conversion information;

wherein the magnetic field is generated by the plurality of wire coils each of which is driven by a respective synchronous electric current carrying a respective train of pseudo-random waveforms, and for each respective wire coil, the respective train of pseudo-random waveforms includes the first number of waveform periods and is orthogonal to each other train of pseudo-random waveforms of the wire coils distinct from the respective wire coil.

* * * * *